United States Patent
Takashima et al.

[19]

[11] Patent Number: 5,859,805
[45] Date of Patent: Jan. 12, 1999

[54] DYNAMIC SEMICONDUCTOR MEMORY DEVICE HAVING AN IMPROVED SENSE AMPLIFIER LAYOUT ARRANGEMENT

[75] Inventors: Daisaburo Takashima, Yokohama; Kenji Tsuchida, Kawasaki; Yukihito Oowaki, Yokohama, all of Japan

[73] Assignee: Kabushiki Kaisha Toshiba, Kawasaki, Japan

[21] Appl. No.: 832,818

[22] Filed: Apr. 4, 1997

Related U.S. Application Data

[63] Continuation of Ser. No. 272,284, Jul. 8, 1994, Pat. No. 5,644,525, which is a continuation of Ser. No. 47,383, Apr. 19, 1993, abandoned, which is a continuation of Ser. No. 864,184, Apr. 3, 1992, abandoned, which is a continuation of Ser. No. 433,013, Nov. 7, 1989, abandoned.

[30] Foreign Application Priority Data

Nov. 7, 1988 [JP] Japan ................................. 63-280636
Jan. 9, 1989 [JP] Japan ..................................... 1-2456

[51] Int. Cl.$^6$ ........................................ G11C 5/02
[52] U.S. Cl. .................... 365/205; 365/51; 365/63
[58] Field of Search ........................ 365/205, 51, 63, 365/72, 208, 207

[56] References Cited

U.S. PATENT DOCUMENTS

| 4,903,344 | 2/1990 | Inoue | 365/51 |
| 4,922,459 | 5/1990 | Hidaka | 365/206 |

FOREIGN PATENT DOCUMENTS 56-134756  10/1981  Japan.

*Primary Examiner*—A. Zarabian
*Attorney, Agent, or Firm*—Oblon, Spivak, McClelland, Maier & Neustadt, P.C.

[57] ABSTRACT

A dynamic semiconductor memory device is made up of a plurality of dynamic memory cells arrayed along a plurality of bit line pairs, and a plurality of dynamic sense amplifiers associated with the plurality of bit line pairs, each sense amplifier having a pair of MOS transistors connected to a corresponding pair of bit lines. In one embodiment, the first and second transistors of one of the sense amplifiers and the first and second transistors of another sense amplifier adjacent thereto are positioned within a region defined by two adjacent pairs of bit lines. Each of the bit line pairs has first and second bit lines extending in a first direction perpendicular to a second direction in which the source and drain regions are formed in the semiconductor substrate so that the transistors of the sense amplifiers are arranged one for every four bit lines in the second direction.

7 Claims, 20 Drawing Sheets

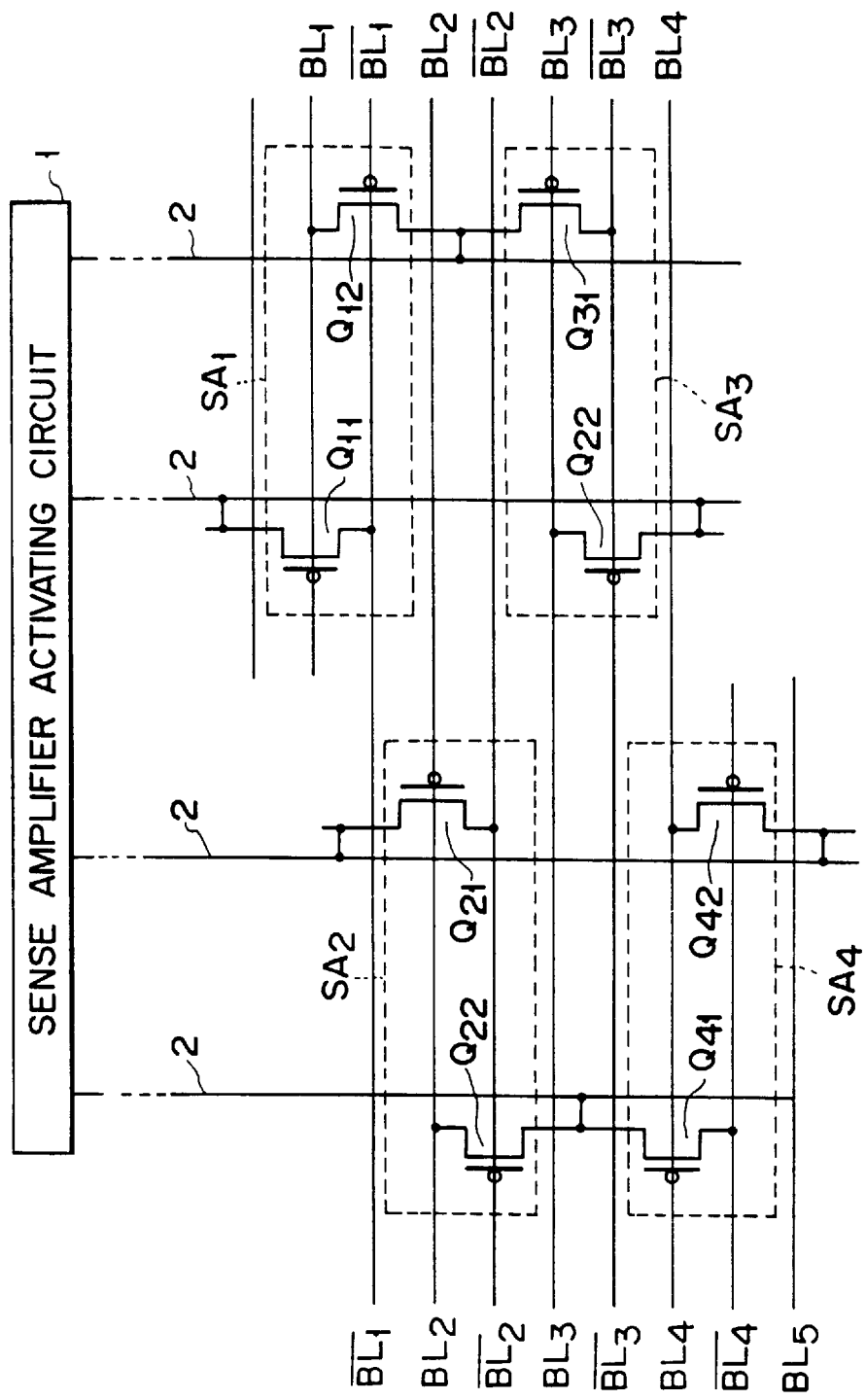
F I G. 4

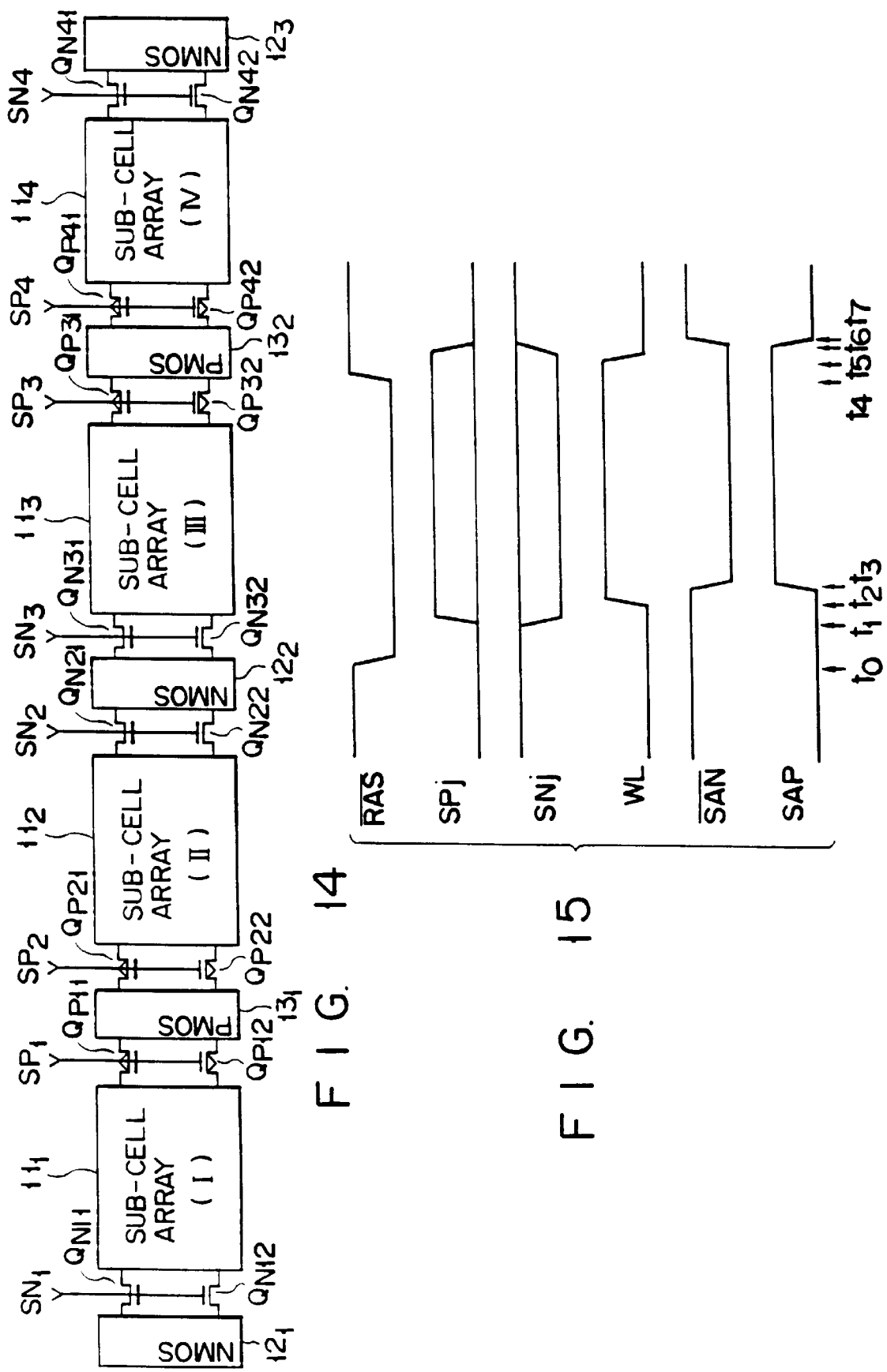
F I G. 14
F I G. 15

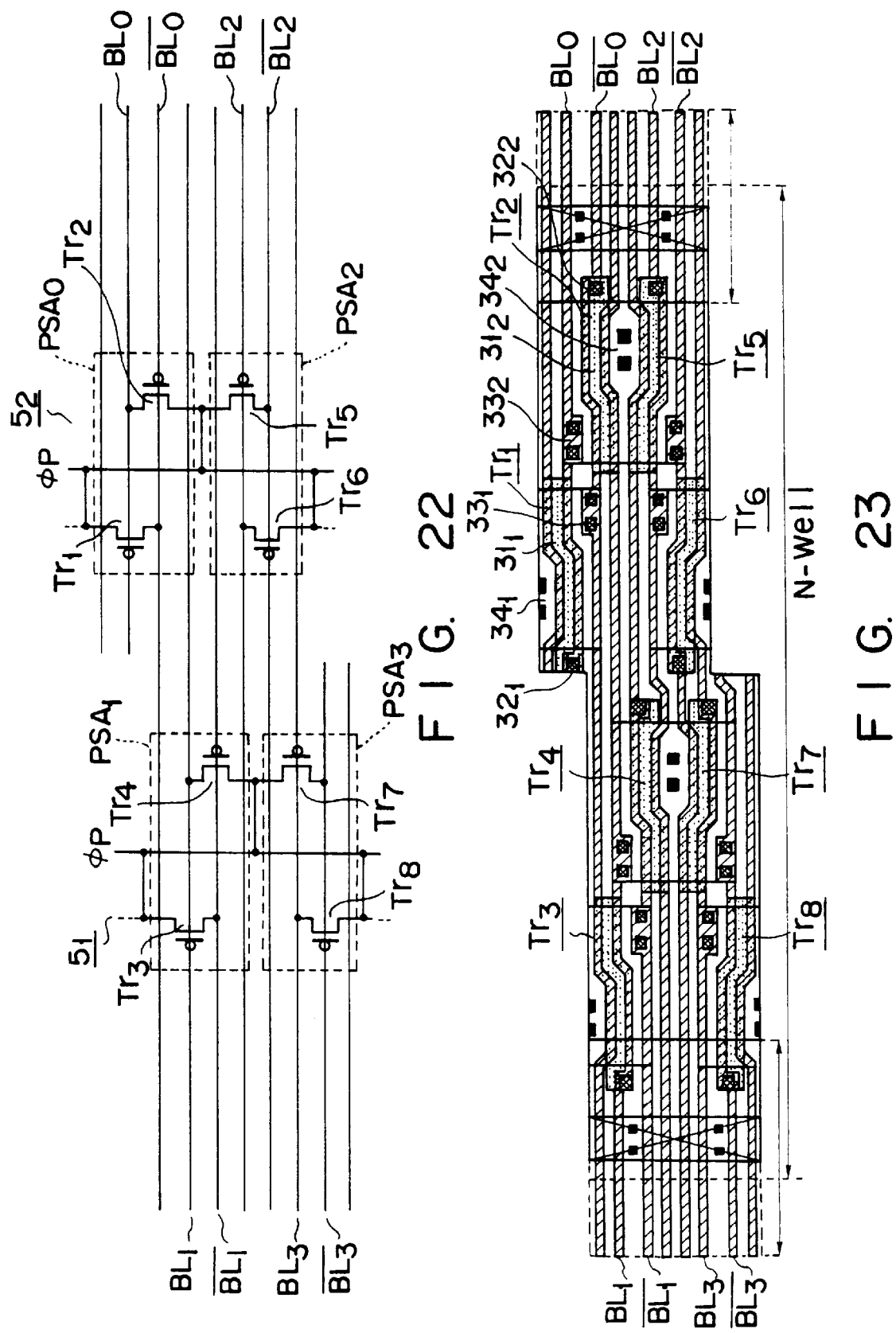

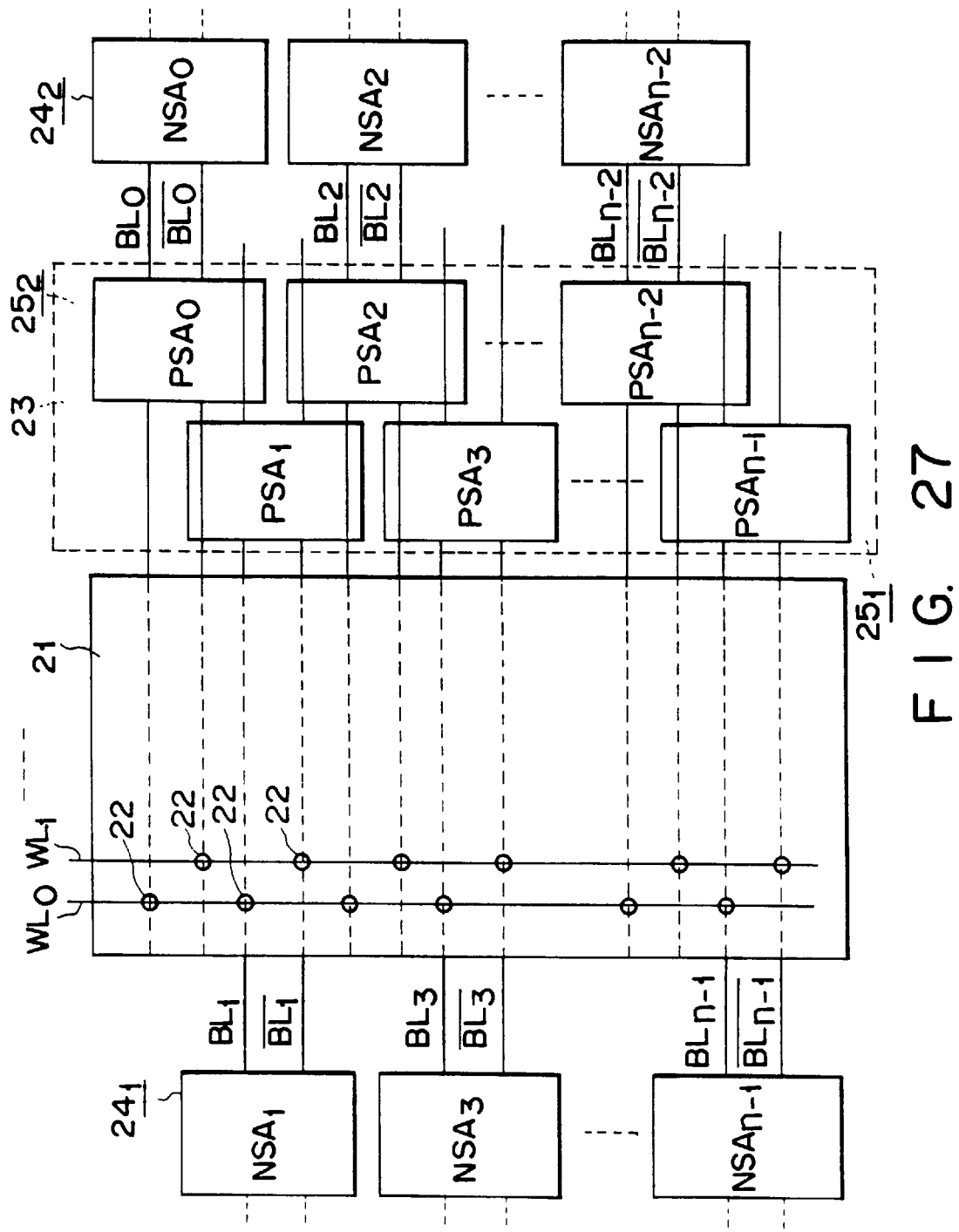
F I G. 27

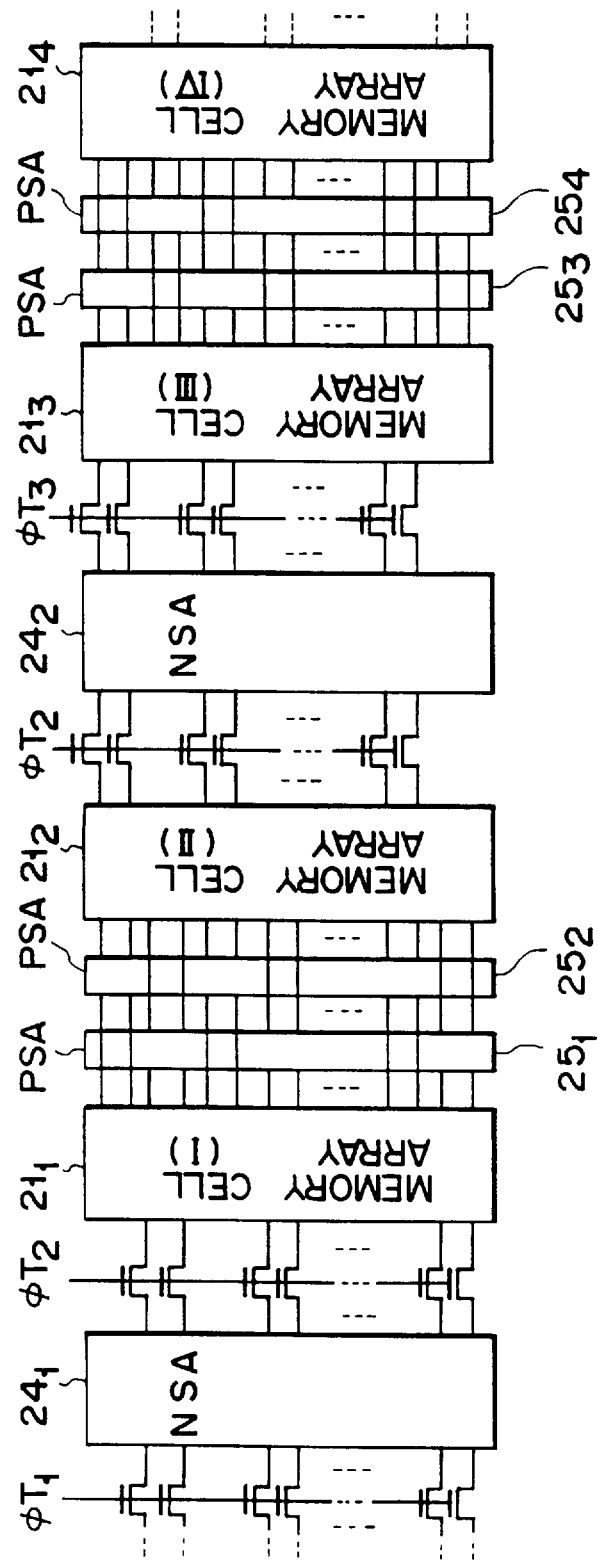
F I G. 28

DYNAMIC SEMICONDUCTOR MEMORY DEVICE HAVING AN IMPROVED SENSE AMPLIFIER LAYOUT ARRANGEMENT

This is a Continuation, of application Ser. No. 08/272, 284 filed on Jul. 8, 1994, now U.S. Pat. No. 5,644,525 which is a continuation of U.S. Pat. No. 08/047,383 filed on Apr. 19, 1993, now abandoned, which was a continuation of U.S. Pat. No. 07/864,184 filed on Apr. 3, 1992, now abandoned, which was a continuation of U.S. Pat. No. 07/433,013 filed on Nov. 7, 1989, now abandoned.

BACKGROUND OF THE INVENTION

1. Field of the Invention

The present invention relates to a dynamic random access memory (DRAM) device, and more particularly to a semiconductor memory device with improved layouts of bit lines and sense amplifiers.

2. Description of the Related Art

Improvement of memory cell structures and advancement of the microfabrication technique have remarkably increased an integration density of the DRAM whose memory cells consist of one transistor and one capacitor. In reading out data from a memory cell array of the DRAM, the data from the cell array is applied through paired bit lines to a sense amplifier. The data is amplified by the sense amplifier and then outputted from the memory device. At present, many companies competitively develop the DRAMs of 16 mega bits. In the case of the DRAM of such a high integration density, memory cell size, bit line width, and bit line pitch are extremely small. The active element, or MOS transistor, contained in the sense amplifier is limited in reducing its size, because the element characteristic and the required processing accuracy must be secured. The limit of the element size reduction makes it difficult to lay out the sense amplifiers in connection with the bit line pairs.

A conventional sense amplifier is of the flip-flop type in which a plurality of MOS transistors are connected between paired bit lines. The source common to two MOS transistors is connected to a sense amplifier activating circuit through a control line. To operate the sense amplifier, a source potential is controlled through the control line in an active mode.

Usually, in connection with the bit line pairs, a dynamic sense amplifier is formed by combining two types of sense amplifiers, a sense amplifier (NMOS sense amplifier) using n-channel MOS transistors and another sense amplifier (PMOS sense amplifier) using p-channel MOS transistors. The NMOS sense amplifier is for amplifying a minute potential difference between the paired bit lines, viz., a low potential. The PMOS amplifier is for amplifying the amplified potential difference up to a maximum amplitude, viz., a high potential. These types of sense amplifiers, NMOS and PMOS, are each constructed with a flip-flop using a couple of MOS transistors, and the circuit arrangements of them are the same.

In the layout of the conventional DRAM, a single MOS transistor is connected to respective ones of for a pair of bit lines such that the drain and gate thereof are connected to respective ones of the parallel bit lines and the source is connected to a control line. In such a layout, where the bit line width and the bit line pitch are extremely narrow, e.g, 0.5 μm, the size of the MOS transistor per se and the contact regions must be correspondingly extremely small. However, there is a limit in reducing the size of them for the above reason, guaranteeing the element characteristics and the required processing accuracy.

There is known a divided sense amplifier system in which a sense amplifier is divided into a plurality of sense amplifiers. In this system, however, two n-wells are required for a single memory cell array, to divide the PMOS sense amplifier into two groups. The well separation consumes a large chip area. Particularly in the case of a large capacity DRAM, to secure a high speed operation, it is necessary to divide the memory cell array into 8 to 16 blocks in the bit line direction. Use of the two n-wells every divided cell array greatly hinders improvement of an integration density.

As described above, the conventional layout of the sense amplifier section of the DRAM does not result in a further increase of the integration density.

SUMMARY OF THE INVENTION

Accordingly, an object of the present invention is to provide a DRAM having such a layout of the sense amplifier section as to provide a high integration density, while securing the required areas for the active elements and their contact areas.

According to one aspect of the present invention, there is provided a DRAM in which, a plurality of sense amplifiers are separately arrayed in the bit line direction so that one MOS transistor is arranged for a plurality of bit line pairs.

In the above arrangement, one sense amplifier is disposed for a plurality of bit line pairs. With this, a DRAM whose bit line width and bit line pitch are extremely narrow can be designed with fewer design restrictions, particularly with respect to the transistors and the contact portions in the sense amplifier section. Accordingly, it is easy to manufacture DRAMs with high integration density.

According to another aspect of the present invention, there is provided a dynamic semiconductor memory device in which a first group of sense amplifiers including first conductivity channel MOS transistors and a second group of sense amplifiers including second conductivity channel MOS transistors are provided for a plurality of pairs of bit lines in each of a plurality of sub-memory cell arrays obtained by dividing a memory cell array, the plurality of the pairs of bit lines are alternately led from both sides of each sub-memory cell array, the first sense amplifier group is divided into two subgroups, one subgroup being disposed on one side of the memory cell array, and the other being disposed on the other side, and the second sense amplifier group is divided into two subgroups, the subgroups being all disposed in a single well of a first conductivity type which is located in or on one side of each memory cell array. According to the above semiconductor memory device, the design rule can be relaxed as compared with a sense amplifier system wherein a plurality of bit line pairs are led from one side of the memory cell array, to arrange a single group of sense amplifiers on the one side. Further, similar to the divided sense amplifier system wherein a plurality of bit line pairs are alternately led from both sides of the memory cell array, to arrange two groups of sense amplifiers on each side of the memory cell array, the design rule for designing a memory circuit can be largely relaxed. The present invention relates to the use of an improved layout of sense amplifiers in the memory circuit. Further, two sense amplifier groups formerly formed in two well regions can be fabricated in a single well region. In the prior art, for example, two sense amplifier groups have been fabricated in two well regions, respectively. In contrast, in the present invention, two sense amplifier groups can be fabricated in a single well region. Accordingly, the number of required wells can be reduced, leading to the effective use of the chip area and hence large capacity DRAMs.

BRIEF DESCRIPTION OF THE DRAWINGS

FIG. 4 is an equivalent circuit of a layout of a sense amplifier section in a DRAM according to a second embodiment of the present invention;

FIG. 14 is a circuit diagram of a memory circuit incorporating the present invention;

FIG. 15 shows a timing chart for explaining the operation of the memory circuit of FIG. 14;

FIG. 22 is an equivalent circuit of the sense amplifier section of FIG. 21;

FIG. 23 is a plan view showing a layout of the sense amplifier section of FIG. 22;

FIG. 27 shows a diagram of an arrangement of a DRAM according to a tenth embodiment of the present invention; and FIG. 28 shows a diagram of an arrangement in which a plurality of memory cell arrays of FIG. 21 are laid out.

DETAILED DESCRIPTION OF THE PREFERRED EMBODIMENTS

Figure 1A:
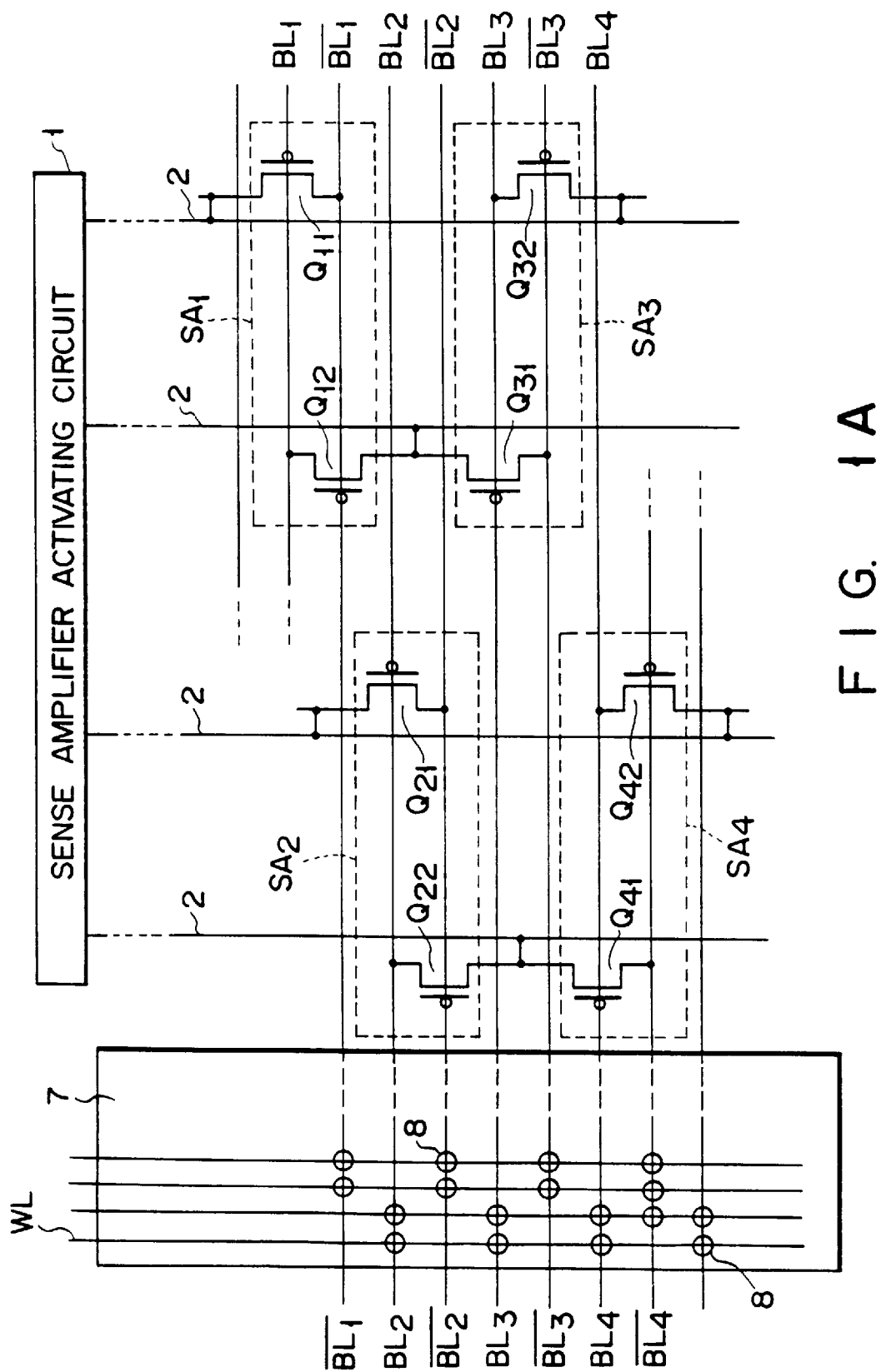
FIG. 1A is an equivalent circuit of a layout of a sense amplifier section in a DRAM according to a first embodiment of the present invention.

Reference is made to FIG. 1A showing a DRAM (Dynamic Random Access Memory) comprising a sense amplifier activating circuit 1, a plurality of sense amplifiers (for example, SA1 to SA4) connected to a plurality of bit lines BL1, $\overline{BL1}$, BL2, $\overline{BL2}$, . . . , and to the sense amplifier activating circuit 1 through a plurality of control lines 2, and a memory cell array 7 including a plurality of memory cells 8 connected to the bit lines BL1, $\overline{BL1}$, . . . , respectively. The flip-flop type dynamic sense amplifiers SA1 to SA4 are arranged in parallel in the direction in which the bit lines extend, i.e., the bit line direction.

Figure 1B:
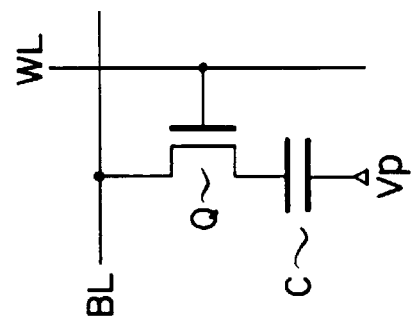
FIG. 1B is an equivalent circuit of the DRAM memory cell.

As shown in FIG. 1B, the memory cell 8 consists of a MOS transistor Q whose gate is connected to a word line WL and a MOS capacitor Q, a plate voltage Vp is applied.

Figure 2:
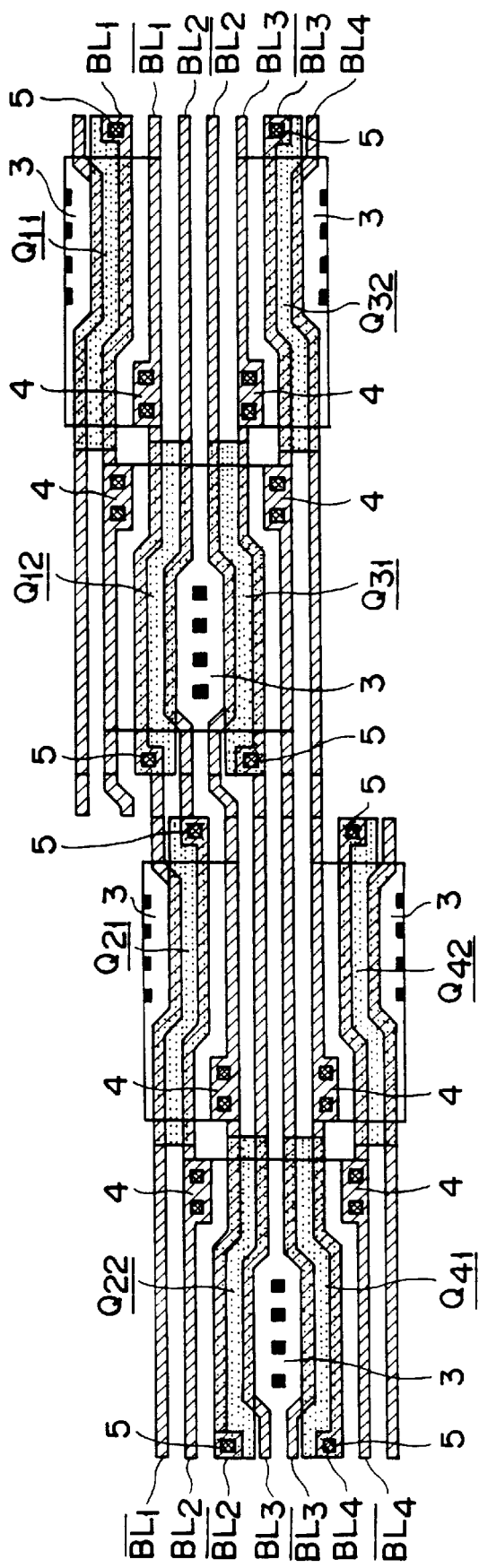
FIG. 2 is a plan view showing the layout of the sense amplifier section of FIG. 1A.

The sense amplifier SA1 is fabricated by a couple of MOS transistors Q11 and Q12 whose gates are coupled to bit lines BL1 and $\overline{BL1}$, respectively. The sense amplifier SA2 is fabricated by a couple of MOS transistors Q21 and Q22 whose gates are coupled to bit lines BL2 and $\overline{BL2}$, respectively. In the sense amplifiers SA1 and SA2, the transistors Q11, Q12, Q21 and Q22 are successively inverted in the source and drain connection. Similarly, a total of four transistors, a couple of MOS transistors Q31 and Q32 forming the sense amplifier SA3 coupled with a pair of bit lines BL3 and $\overline{BL3}$, and a couple of MOS transistors Q41 and Q42 forming the sense amplifier SA4 coupled with a pair of bit lines BL4 and $\overline{BL4}$, are arrayed in the bit line direction. The sense amplifier SA4 is the inversion of the sense amplifier SA2 in the source and drain connection of the transistors. The same thing is true for the amplifiers SA3 and SA1. In FIG. 1A, a sense amplifier activating circuit 1 is coupled with control lines 2 connecting respectively to the common source terminals of the transistors in the sense amplifiers SA1 to SA4. In FIG. 2, dotted regions show gate electrodes of MOS transistors, and are made of a conductive layer such as polysilicon layer. The source and drain regions are formed as diffusion regions in a semiconductor substrate, by self-alignment with the corresponding gate electrode in the region shown as rectangular region in FIG. 2. The shaded lines are the bit lines positioned above the structure, and are made of, for example, a polycide layer or stacked structure of polysilicon and silicide such as MOSi. FIG. 2 shows contact holes between bit lines and drain regions, gate contacts, and also shows contact holes (black) between source regions and control lines 2. In FIG. 2, source contact portions 3 are respectively coupled with the control lines 2 such as Al crossing over the bit lines. Drain contact portions 4 are used for the connection of drain regions with bit lines, and gate contacts 5 are used for the connection of the gate electrodes with the bit lines. As seen from the drawing of FIG. 2, one bit line is provided between the gate contact portion and the source contact portion 3 of each MOS transistor. This bit line is independent of the transistor operation.

Figure 3:
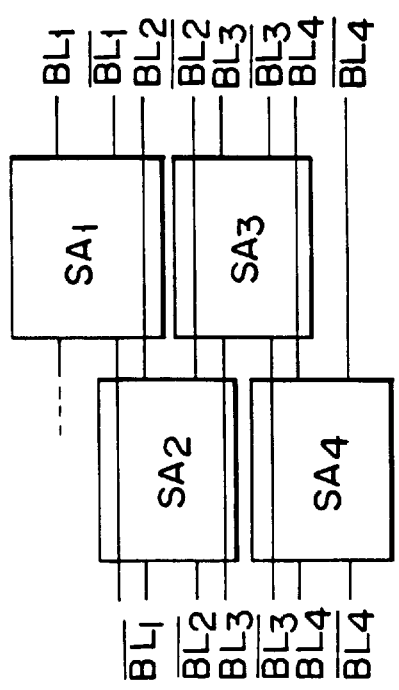
FIG. 3 is a diagram schematically illustrating the layout of the sense amplifier section of the DRAM of FIG. 1A.

The layout of the four sense amplifiers SA1–SA4 shown in FIGS. 1A and 2 may be modeled as shown in FIG. 3. The sense amplifiers thus laid out are repeatedly arrayed in the direction orthogonal to the bit lines, thereby forming a group of sense amplifiers that are arrayed in series.

In the layout of the four sense amplifiers SA1–SA4 shown in FIGS. 1A and 2, the transistors are arrayed one for four bit lines as viewed in the direction orthogonal to the bit line extending direction.

Figure 5:
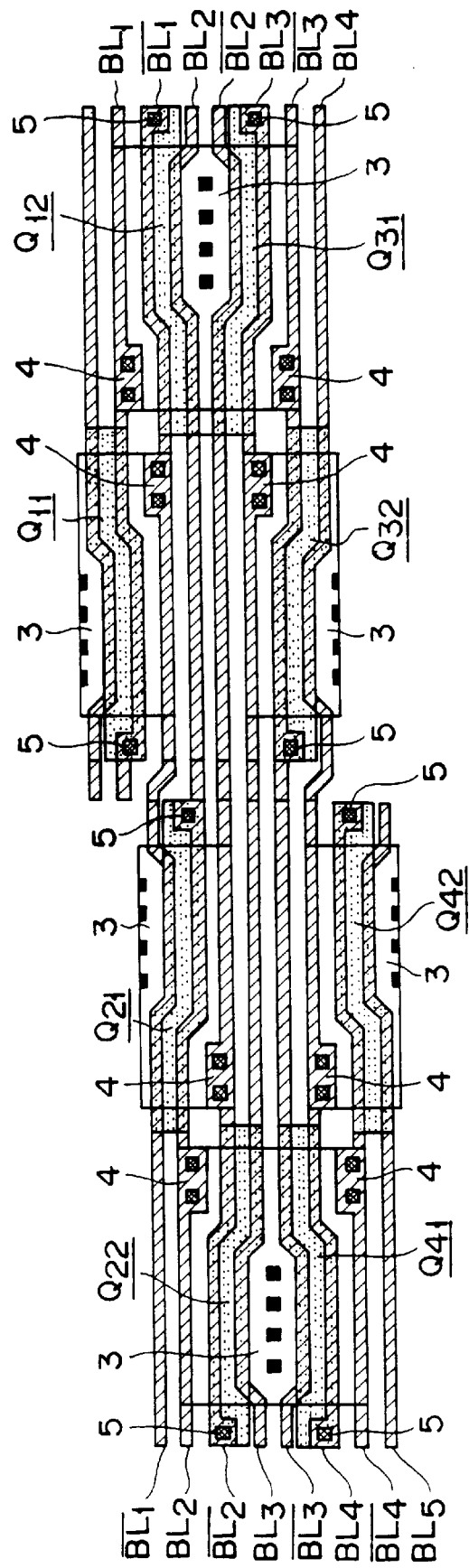
FIG. 5 is a plan view showing the layout of the sense amplifier section of FIG. 4.

FIG. 4 shows an equivalent circuit of sense amplifiers of a DRAM according to a second embodiment of the present invention. FIG. 5 shows a layout pattern of the sense amplifier of FIG. 5. In the instant embodiment, the layout pattern of the sense amplifiers SA2 and SA4 is the same as that of the corresponding amplifiers in the first embodiment. However, the layout pattern of each amplifier SA1 and SA3 in this embodiment corresponds to that of each amplifier SA1 and SA3 in the first embodiment of which the right and left sides are interchanged.

Also in this embodiment, a single sense amplifier is disposed for four bit lines. Accordingly, in designing sense amplifiers, a large chip area may be used for forming the sense amplifiers. This makes its design easy.

Figure 6:
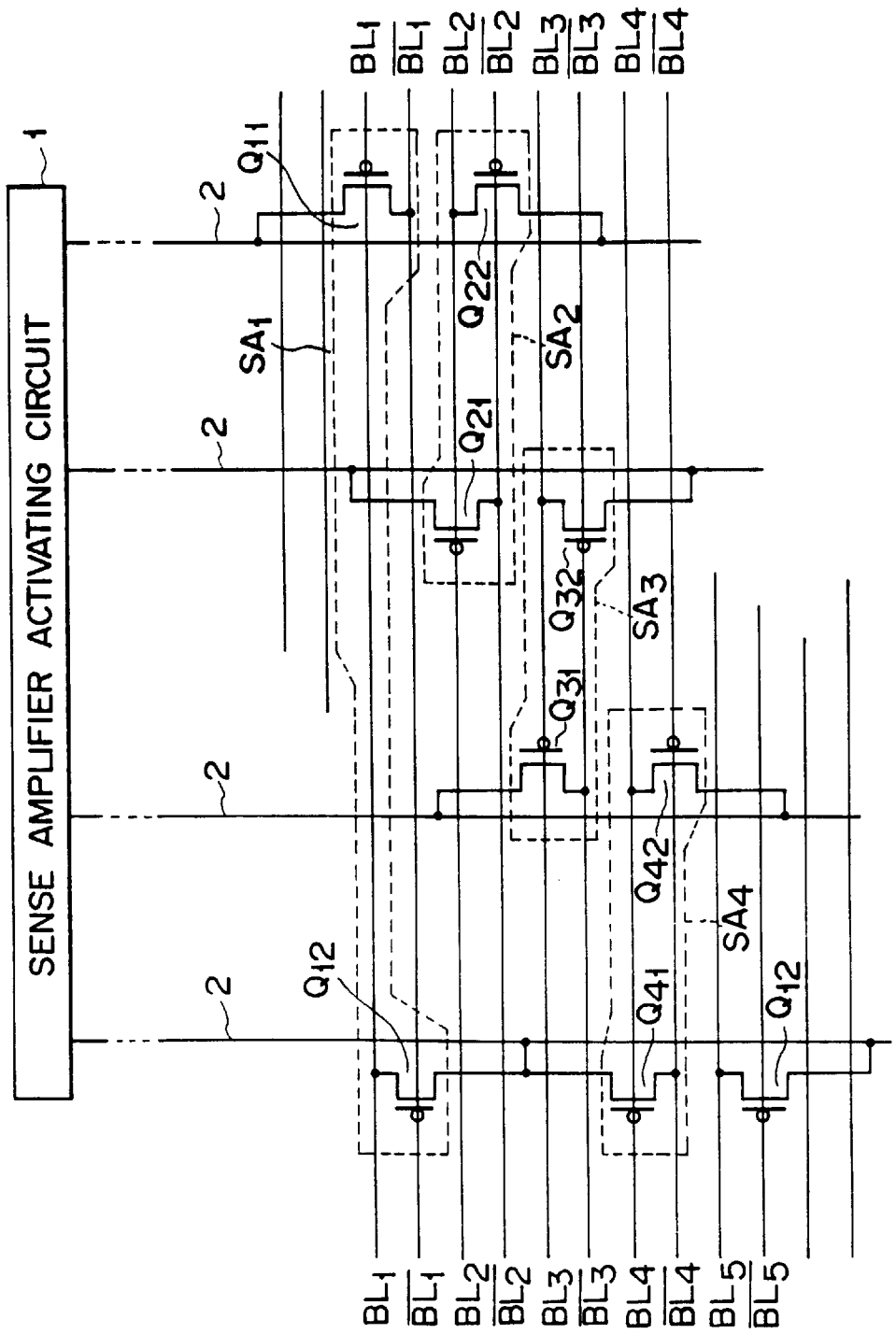
FIG. 6 is an equivalent circuit of a layout of a sense amplifier section in a DRAM according to a third embodiment of the present invention.
Figure 7:
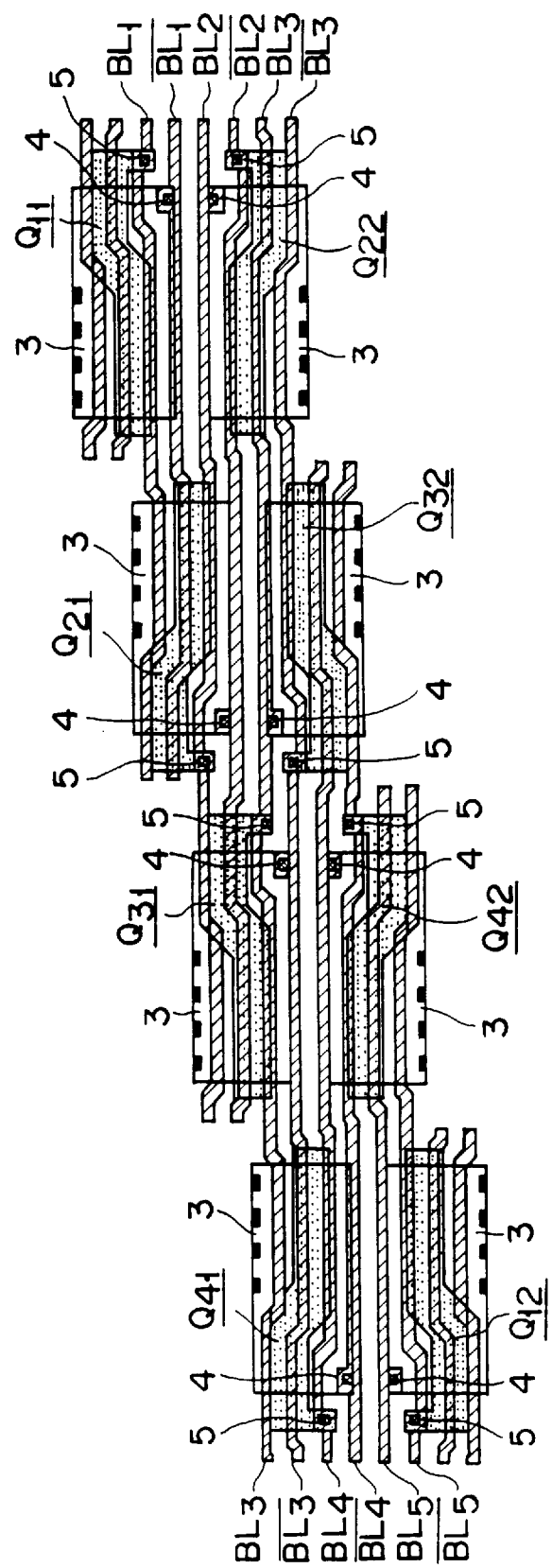
FIG. 7 is a plan view showing the layout of the DRAM of FIG. 6.

In FIGS. 6 and 7 showing a sense amplifier section of a DRAM according to a third embodiment of the present invention, four sense amplifiers SA1 to SA4 are disposed in the bit line direction, as in the above-mentioned embodiments. Further, four stages of MOS transistors are arrayed in the bit line direction. This is also the same as that of the previous embodiments. In this embodiment, the first and second stages (as seen from the left side in the drawing) of MOS transistors Q41 and Q42 make up the sense amplifier SA4 for paired bit lines BL4 and $\overline{BL4}$; the second and the third stages of MOS transistors Q31 and Q32, the sense amplifier SA3; the third and fourth stages of MOS transistors Q21 and Q22, the sense amplifier SA2 for paired bit lines BL2 and $\overline{BL2}$; and the fourth and first stages of MOS transistors Q11 and Q12, the sense amplifier SA1 for paired bit lines BL1 and $\overline{BL1}$. For such a combination of the MOS transistors, two bit lines lie between a source contact portion 3 and a gate contact portion 5 of each transistor. In the layout of FIG. 7, the transistor Q12 as the counterpart of the transistor Q11 corresponds to the transistor Q12' in the repetitive patterns shown in FIG. 6. The layout shown in FIG. 7 is a basic layout of the sense amplifier section. Lines of sense amplifiers are formed by repetitively arraying a number of the basic layouts.

Also in this embodiment, one MOS transistor is disposed for four bit lines. Accordingly, the effect of softening the design restrictions may be attained.

Also in the third embodiment, the right and left sides of the pattern of each transistor may be interchanged as in the first and second embodiments. The patterns when those are interchanged are not illustrated.

Figure 8:
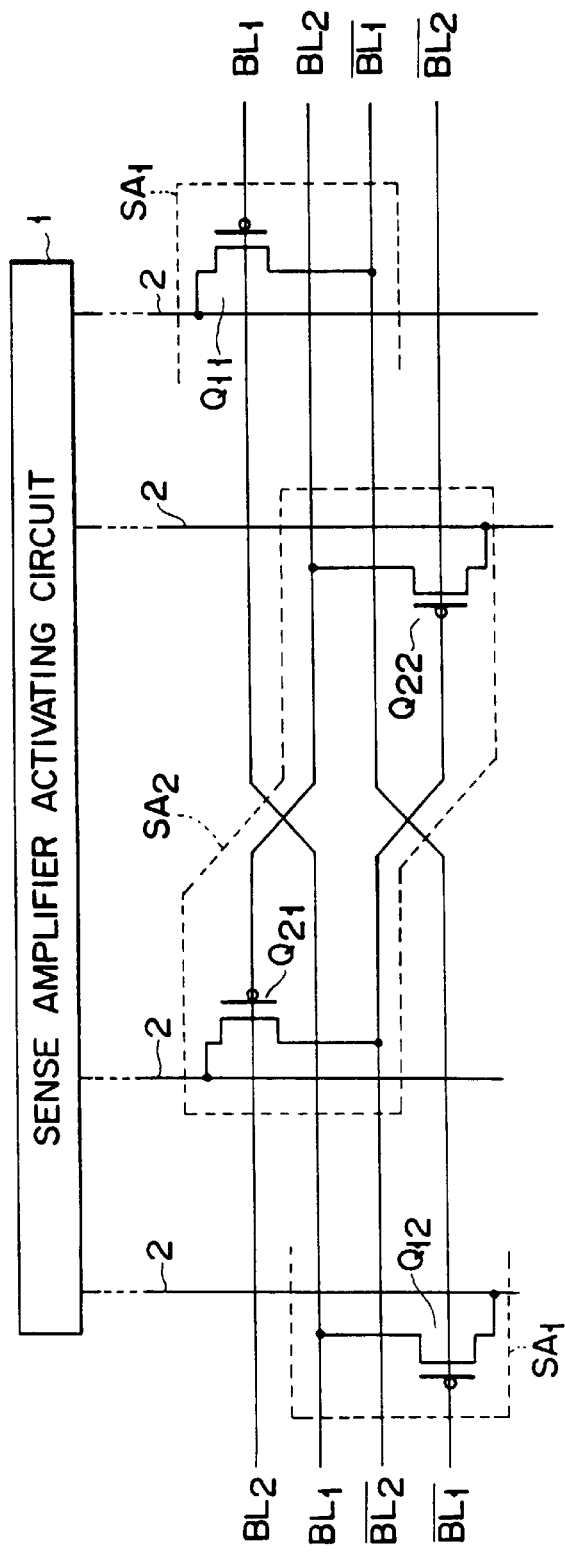
FIG. 8 is an equivalent circuit of a layout of a sense amplifier section in a DRAM according to a fourth embodiment of the present invention.
Figure 9:
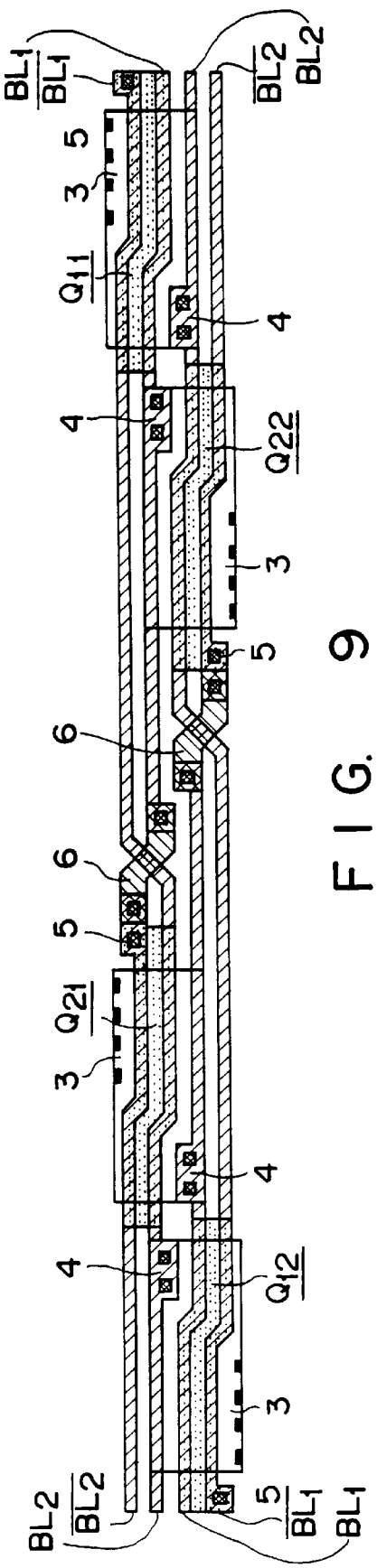
FIG. 9 is a plan view showing the layout of the DRAM of FIG. 8.

FIG. 8 shows an equivalent circuit of a sense amplifier section of a DRAM according to a fourth embodiment of the present invention. FIG. 9 shows a layout of the sense amplifier section. This embodiment employs a special bit line layout in which paired bit lines $\overline{BL2}$ and $\overline{BL2}$ are displaced from paired bit lines BL1 and $\overline{BL1}$ by a half pitch. The paired bit lines BL1 and $\overline{BL1}$ cross at their mid point. Similarly, the paired bit lines BL2 and $\overline{BL2}$ cross. To cross the bit lines, a cross wire 6 as shown in FIG. 9 is required. A total of four stages of MOS transistors are arrayed in such a manner that two stages of transistors are placed on both sides of the mid points. The first and fourth stages (as seen from the left side) of transistors Q12 and Q11 make up a sense amplifier SA1, and the second and third stages of transistors Q21 and Q22 cooperate to form another sense amplifier SA2. While in the above-mentioned embodiments, one or two additional bit lines are disposed between the source contact portion 3 and the gate contact portion 5, a single bit line is disposed between a drain contact portion 4 and a gate contact portion 5 in this embodiment. It is for this reason that the paired bit lines are crossed as shown.

Also in this embodiment, one transistor is provided for four bit lines. Accordingly, the advantageous effects comparable with those in the embodiments already mentioned can be obtained. Incidentally, although this embodiment requires the cross wires, the basic layout is simple as a whole.

Figure 10:
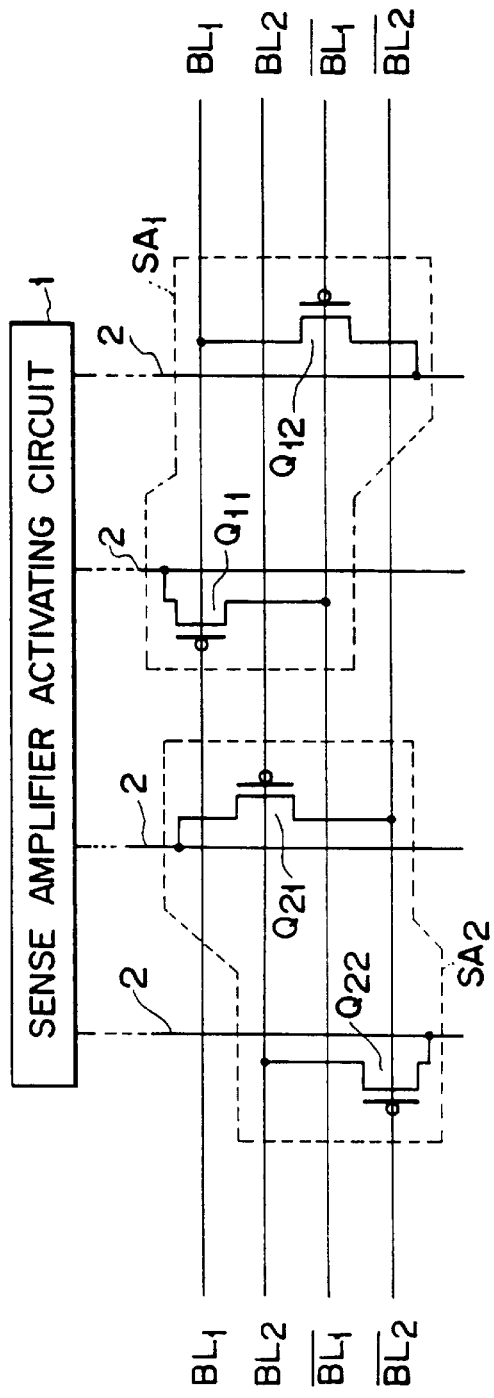
FIG. 10 is an equivalent circuit of a layout of a sense amplifier section in a DRAM according to a fifth embodiment of the present invention.
Figure 11:
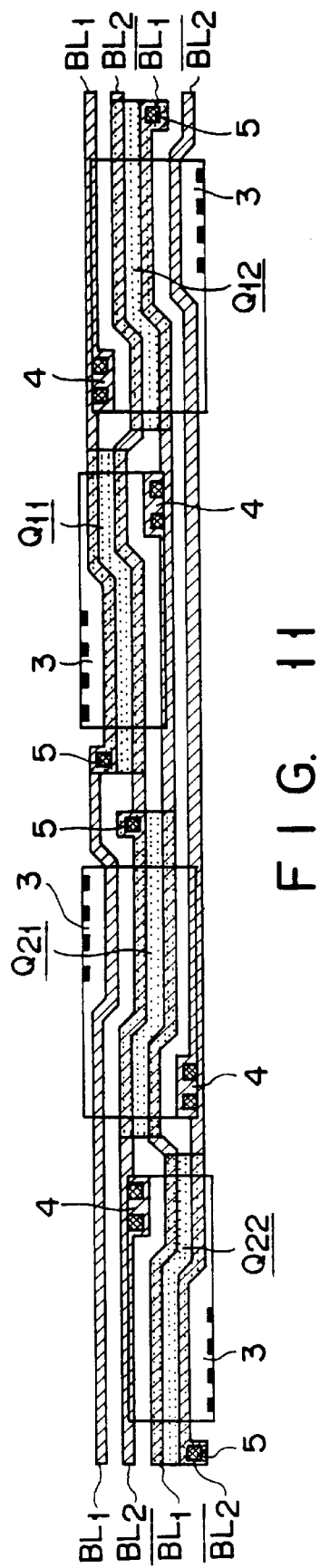
FIG. 11 is a plan view showing the layout of the DRAM of FIG. 10.

A sense amplifier section of a DRAM of a fifth embodiment of the present invention is shown in FIGS. 10 and 11. Also in this embodiment, a pair of bit lines BL1 and $\overline{BL1}$ and another pair of bit lines BL2 and $\overline{BL2}$ are displaced from each other by a half pitch, as in the embodiment of FIGS. 8 and 9, but these paired bit lines are not crossed. MOS transistors Q22, Q21, Q11 and Q12 are arrayed in the bit line direction, and a single bit line extends between a drain contact portion 4 and a gate contact portion 5 of each transistor. More specifically, one bit line BL1 extends between the drain contact portion 4 and the gate contact portion 5 of each transistor Q22 and Q21. Another single bit line BL2 extends between the drain contact portion 4 and the gate contact portion 5 of each transistor Q11 and Q22. The first and second stages of transistors Q22 and Q21 form a sense amplifier SA2 for paired bit lines BL2 and $\overline{BL2}$. The third and fourth stages of transistors Q11 and Q12 form a sense amplifier SA1 for the paired bit lines BL1 and $\overline{BL1}$.

This embodiment can obtain the beneficial effects as mentioned above. A basic layout of the sense amplifier section according to this embodiment is simpler than that of the embodiment of the FIGS. 8 and 9, because the paired bit lines are not crossed.

Figure 12:
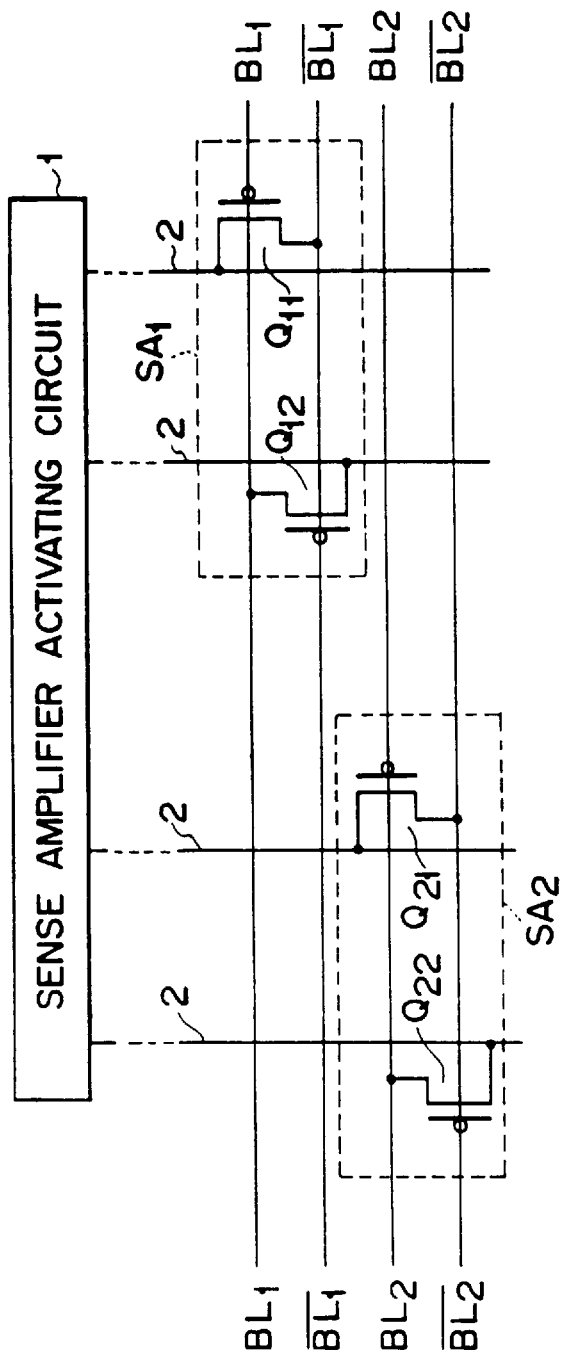
FIG. 12 is an equivalent circuit of a layout of a sense amplifier section in a DRAM according to a sixth embodiment of the present invention.
Figure 13:
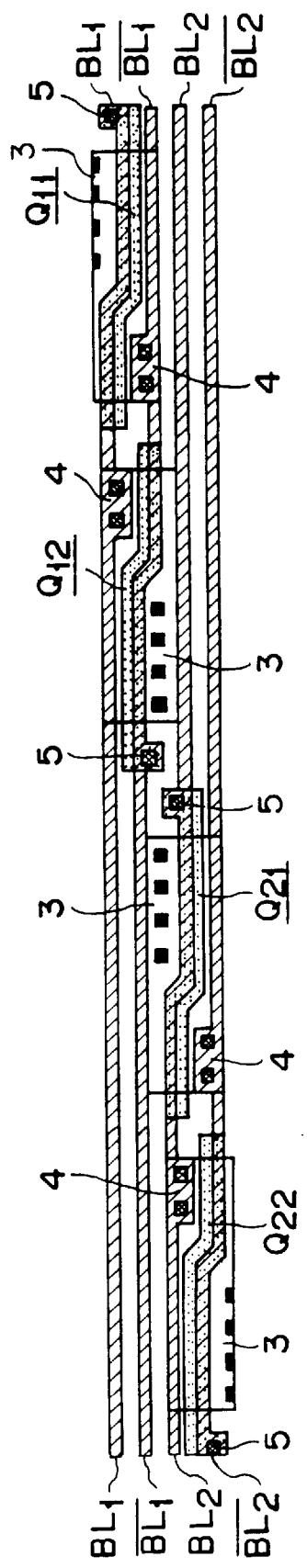
FIG. 13 is a plan view showing the layout of the DRAM of FIG. 12.

A sense amplifier section of a DRAM according to sixth embodiment is illustrated in FIGS. 12 and 13. The layout of the bit line pairs in this embodiment is the same as that of the previous embodiment, and four MOS transistors Q11 to Q22 make up two sense amplifiers SA1 and SA2. As shown in FIG. 12, sense amplifiers SA1 and SA2 are connected to two adjacent bit line pairs, respectively, and are separated from each other in the direction in which the bit line pairs extend. The sense amplifiers SA1 and SA2 are also offset from each other in the direction orthogonal to the direction which the bit line pairs extend, as are the transistors Q11, Q12, and Q21, Q22 within the sense amplifiers SA1 and SA2, respectively. Also in this embodiment, a memory pattern is designed such that four stages of MOS transistors are arrayed in the bit line direction, one transistor for four bit lines. Accordingly, this embodiment is operable with the advantageous effects as mentioned above.

In the description thus far made, the sense amplifier section of the DRAM has been treated. Then, an arrangement of a DRAM incorporating the present invention will be described hereinafter.

In a large scale DRAM, the memory cell array is normally divided into a plurality of blocks. In an instance of FIG. 14, the cell array is divided into four sub-cell arrays $11_1$ to $11_4$. NMOS sense amplifiers $12_1$ to $12_3$ and PMOS sense amplifiers $13_1$ to $13_2$ are alternately disposed between the adjacent sub-cell arrays $11_1$ to $11_4$, as shown. The NMOS sense amplifier 12 disposed on the left side of the first sub-cell array $11_1$ is exclusively used for the sub-cell array $11_1$. The PMOS sense amplifier $13_1$ is provided between the first sub-cell array $11_1$ and the second sub-cell array $11_2$, and is connected to those sub-cell arrays through respective transfer gates of pairs of p-channel MOS transistors QP11 and QP12, and QP21 and QP22. The NMOS sense amplifier $12_2$ is provided between the second sub-cell array $11_2$ and the third sub-cell array $11_3$, and is connected to those sub-cell arrays through respective transfer gates of pairs of n-channel MOS transistors QN21 and QN22, and QN31 and QN32. The PMOS sense amplifier $13_2$ is provided between the third sub-cell array $11_3$ and the fourth sub-cell array $11_4$, and is connected to those sub-cell arrays through respective transfer gates of pairs of p-channel MOS transistors QP31 and QP32, and QP41 and QP42. The NMOS sense amplifier $12_4$ located on the right side of the fourth sub-cell array $11_4$ is used exclusively for this sub-cell array.

In the DRAM shown in FIG. 14, the PMOS sense amplifiers and the NMOS sense amplifiers are separately coupled with the sub-cell cell arrays. The NMOS and PMOS sense amplifiers that are located between the sub-cell arrays, are each used by the sub-cell arrays on its both sides. As seen, the p-channel MOS transistors are used for the transfer gates connecting the PMOS sense amplifier to the sub-cell array, and the n-channel MOS transistors are used for the transfer gates connecting the NMOS sense amplifier to the sub-cell array. Such connections of transistors are used in order that a signal voltage as read out through a potential drop of the threshold value at the transfer gate is amplified with the maximum amplitude between the power source potential and the ground potential.

The operation of the DRAM thus arranged will be described with reference to a timing chart shown in FIG. 15.

Consider a case that a strobe signal $\overline{RAS}$ externally applied goes low (L), and a row address signal is applied to the DRAM, and a sub-cell array $11_2$, for example, is selected by the address signal. In this case, of the control lines SP1 to SP4 coupled with the gates of the p-channel transistors whose logical state is in low (L) level in a precharge mode, the control line SP1 goes high (H), and hence transistors QP11 and QP12 are turned off. As a result, the PMOS sense amplifier $13_1$ is disconnected from the sub-cell array $11_1$. Of the control lines SN1 to SN4 coupled with the gates of the n-channel transistors whose logical state is in high level in a precharge mode, the control line SN3 goes low. Then, transistors QN31 and QN32 are turned off. As a result, the NMOS sense amplifier $12_2$ is disconnected from the sub-cell array $11_8$. Afterwards, one work line WL in the selected sub-cell array $11_2$ is selected, and the data of the memory cells arrayed on this selected work line WL appear on the bit line BL. An activating signal $\overline{SAN}$ to the NMOS sense amplifier goes low and an activating signal SAP to the PMOS sense amplifier goes high. the data appearing on the bit line BL is amplified by a dynamic sense amplifier as the combination of the PMOS and NMOS sense amplifiers $13_1$ and $12_2$, which are located on both sides of the sub-cell array $11_2$.

If the layout of the sense amplifier section as mentioned above is applied to the DRAM with circuit of the divided sense amplifier system, it is easy to manufacture DRAMS with a high integration density, e.g., 16 mega bits or more.

Figure 16:
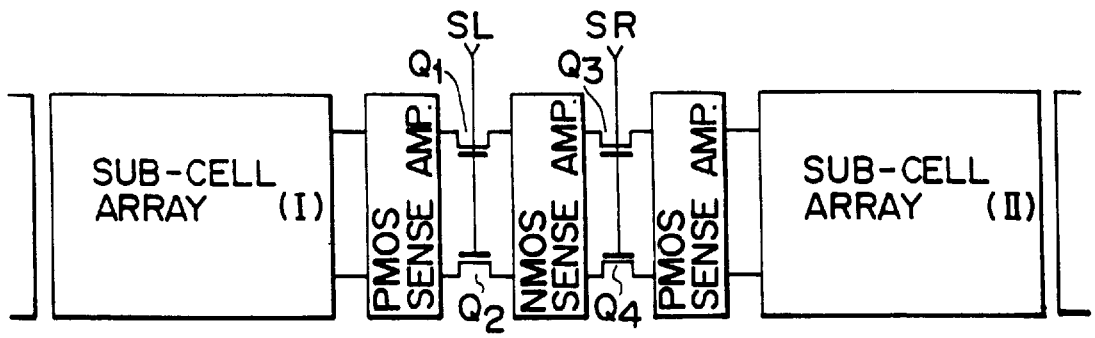
FIG. 16 is a circuit diagram of another core circuit incorporating the present invention.

This invention is applicable for a DRAM with a core circuit of a known divided sense amplifier system, as shown in FIG. 16. In this system, the NMOS sense amplifier, which is disposed between the adjacent sub-cell arrays, is used by them. The PMOS sense amplifiers are located on both sides of the NMOS sense amplifier, and are connected to the NMOS sense amplifiers through transfer gates consisting of n-channel MOS transistors Q1 to Q4, as shown.

Figure 17:
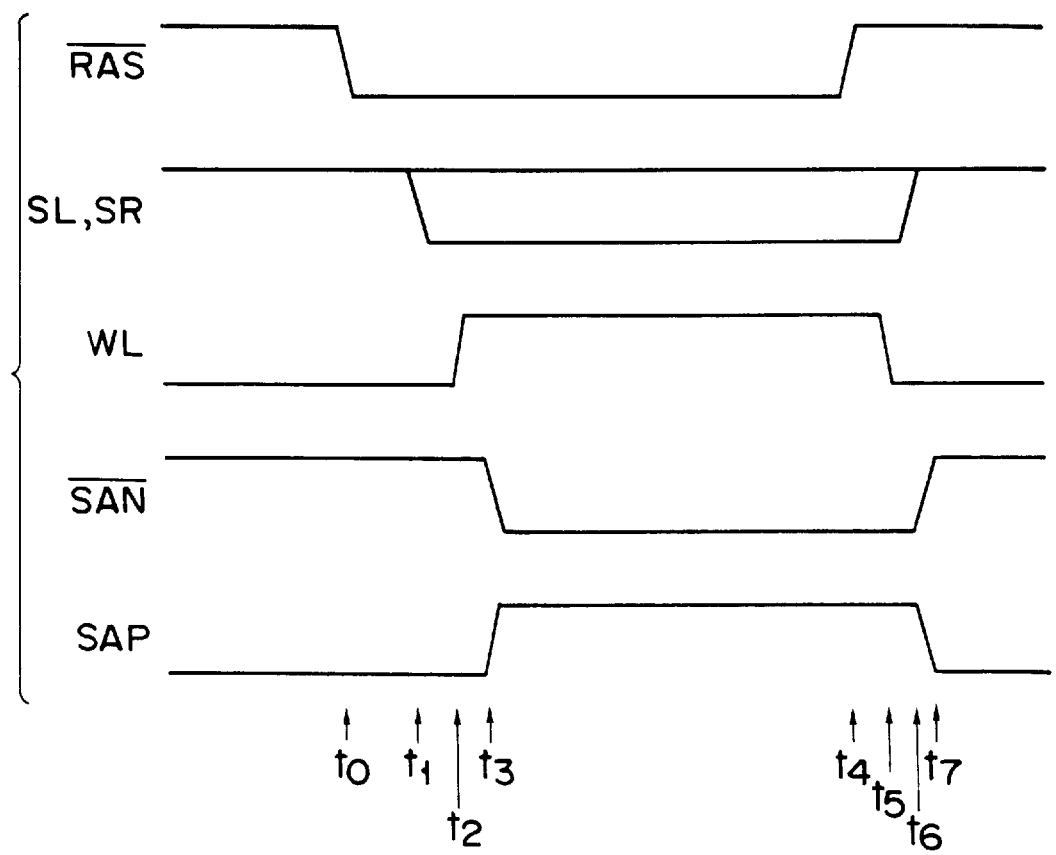
FIG. 17 shows a timing chart for explaining the operation of the memory circuit of FIG. 15.

A timing chart useful in explaining the operation of the DRAM is illustrated in FIG. 17. An activating signal $\overline{RAS}$ goes high, and a low address signal is applied to the DRAM. By the address signal, the sub-cell array (I) on the left side, for example, is selected, and the control line SL goes high, while the control line SR goes low. As a result, the NMOS sense amplifier is connected to the sub-cell array (I). When the sub-cell array (II) on the right side is selected, the control line SR goes high, while the control line SL goes low. The NMOS sense amplifier is connected to the sub-cell array (II).

Also in the case of the above-mentioned divided sense amplifier system in which only the NMOS sense amplifier is used by the adjacent sub-cell arrays, if the layout of the sense amplifier section as mentioned above is applied thereto, high density DRAMs can readily be manufactured.

As seen from the foregoing description, according to the present invention, four stages of MOS transistors making up the sense amplifiers are arrayed in the bit line direction, one transistor for four bit lines. Accordingly, in designing the DRAM whose bit line width and bit line pitch are extremely short, the design restrictions are relaxed. Easy manufacturing of high density DRAMs can be realized.

An additional embodiment of the present invention will be described with reference to FIG. 18.

As shown, in this instance, a memory cell array 21 is divided into two memory cell arrays $21_1$ and $21_2$. Memory cells 2 are located at cross points where paired bit lines BL0 and $\overline{BL0}$, ..., BLn-2 and $\overline{BLn-2}$, and word lines WL0, ..., WLn intersect. Each memory cell is made up of one MOS transistor and one capacitor. The bit lines BL are paired every other line. The odd numbered paired bit lines BL1, $\overline{BL1}$, BL3, $\overline{BL3}$, ... are led from the right side of the memory cell array 21, while the even numbered paired bit lines BL2, $\overline{BL2}$, BL4, $\overline{BL4}$, ... are led from the left side of the memory cell array 21. One group of NMOS sense amplifiers $24_1$, which are arrayed in series, is disposed on the left side of the memory cell array 21. Another group of NMOS sense amplifiers $24_2$, which is also arrayed in series, is disposed on the right side of the cell array 21.

PMOS sense amplifiers PSA1 to PSAn-2 are gathered and contained in an n-type well (n-well) 23 that is located between the sub-cell arrays $21_1$ and $21_2$. In the well 23, those sense amplifiers are divided into two groups of sense amplifiers, a sense amplifier group $25_1$ having a series of PMOS sense amplifiers PSA1, PSA3, ... for the odd numbered bit line pairs, and another sense amplifier group $25_1$ having a series of PMOS sense amplifiers PSA0, PSA2, ... for the even numbered bit line pairs.

Figure 18:
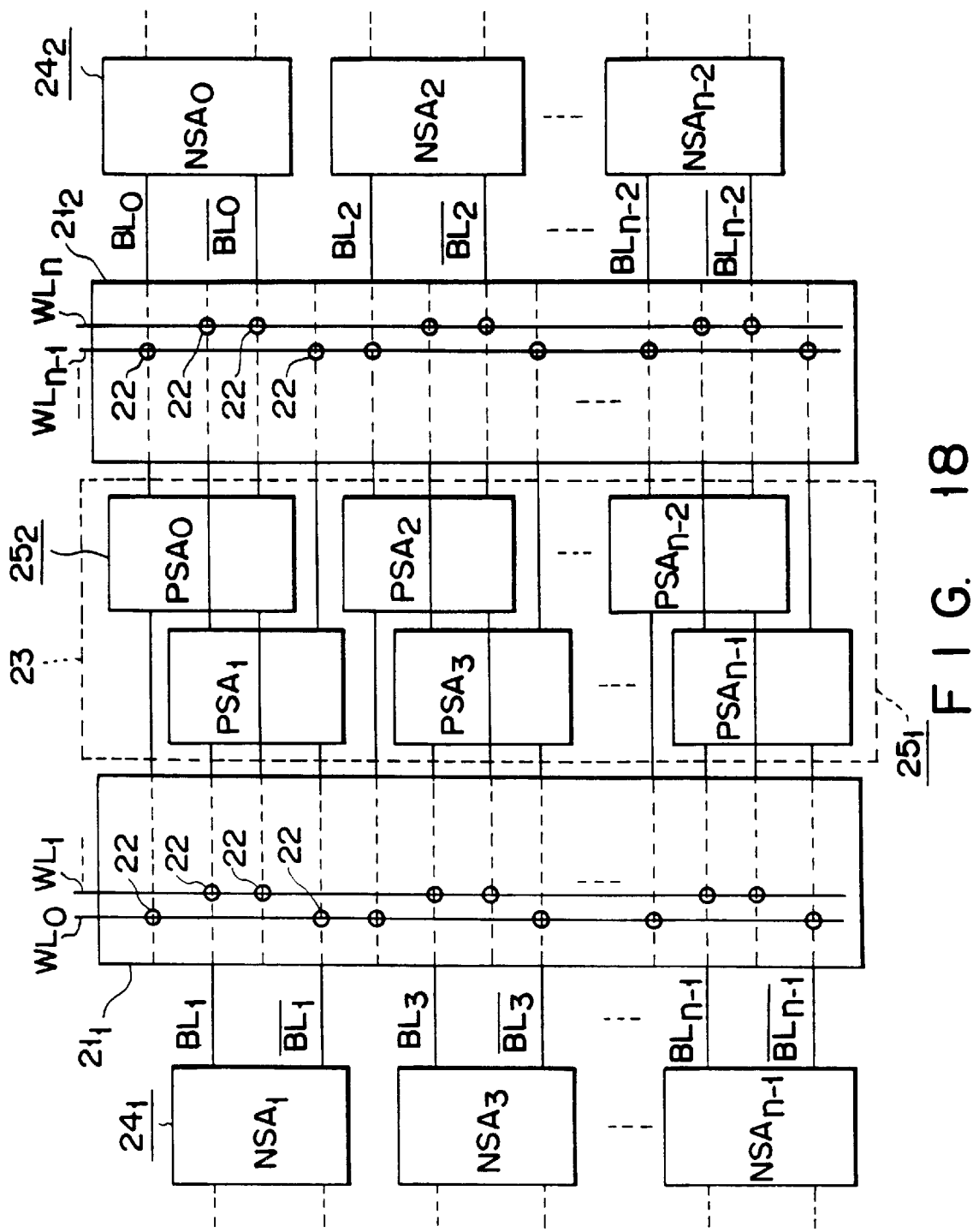
FIG. 18 shows a diagram of an arrangement of a DRAM core circuit according to a seventh embodiment of the present invention.
Figures 19, 20A:
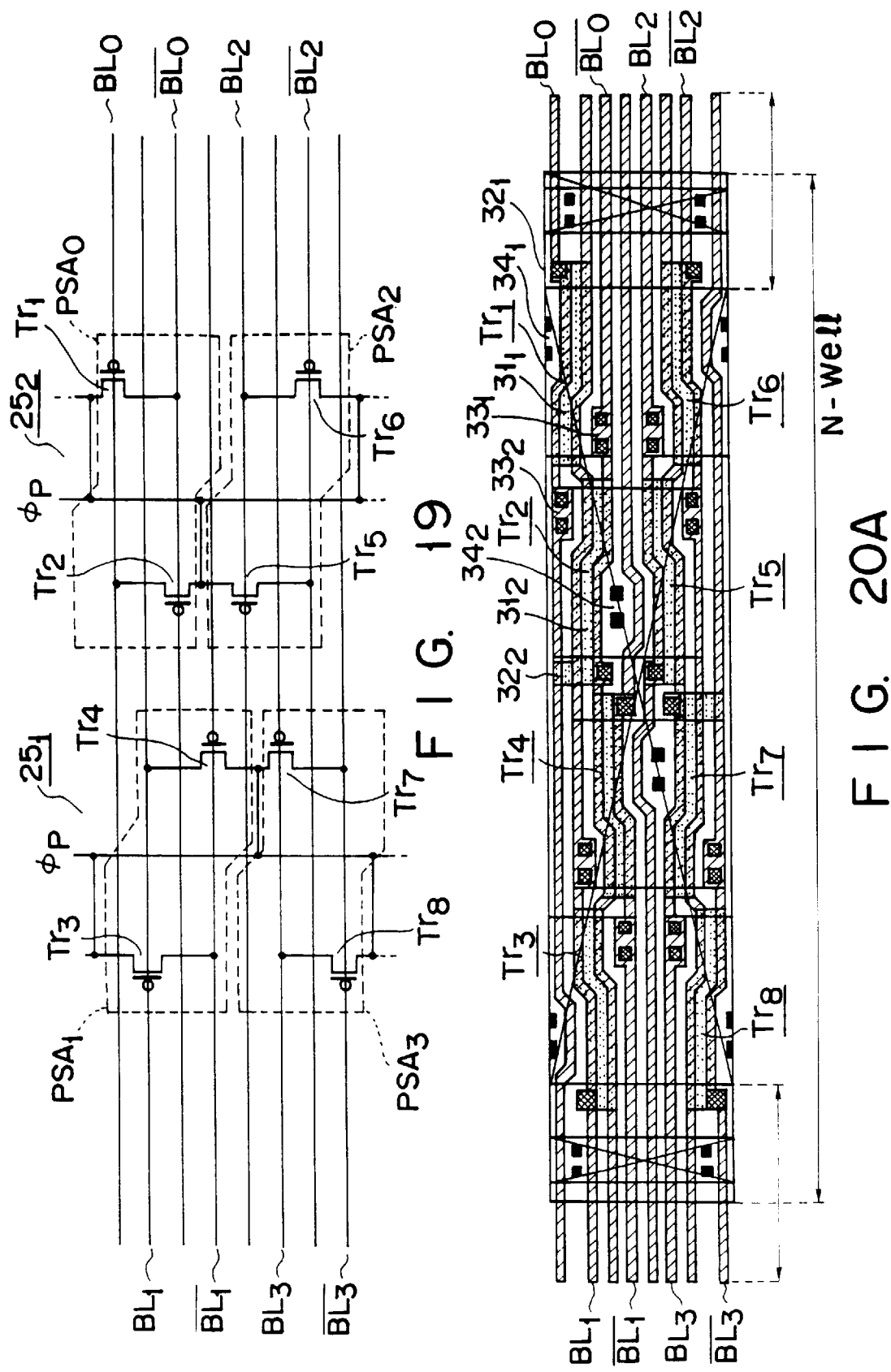
FIG. 19 is an equivalent circuit of the sense amplifier section of FIG. 18.
FIG. 20A is a plan view showing a layout of the sense amplifier section of FIG. 18.
Figure 20B:
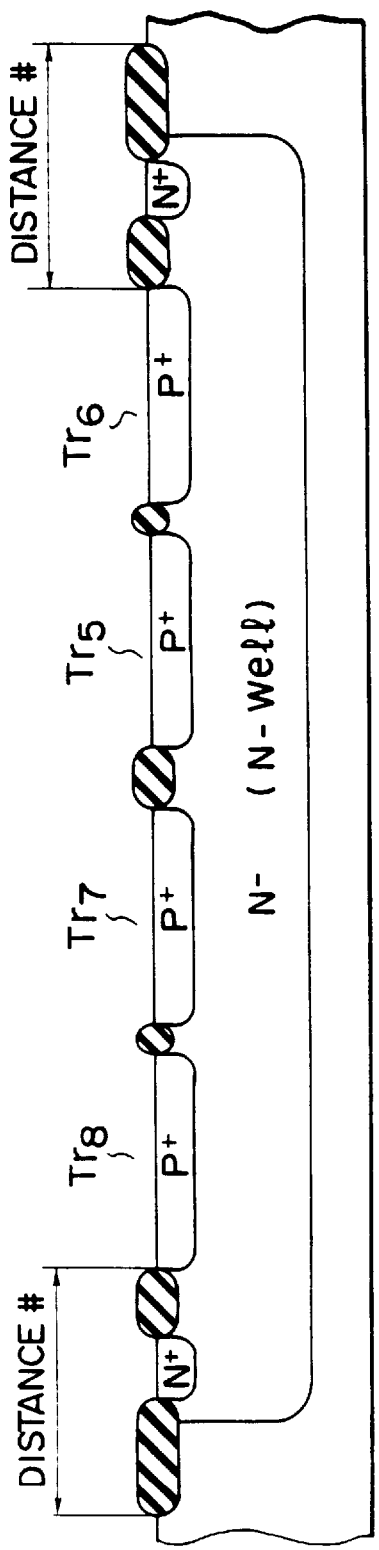
FIG. 20B shows a cross sectional view of the sense amplifier section of FIG. 20A.

FIG. 19 is an equivalent circuit of the sense amplifier of FIG. 18. A layout of the sense amplifier section is illustrated in FIG. 19. FIG. 20B shows a cross sectional view of the sense amplifier section of FIG. 20A.

PMOS sense amplifiers PSA0 to PSA3 are respectively constructed with pairs of p-channel MOS transistors Tr1 and Tr2, Tr3 and Tr4, Tr5 and Tr6, and Tr7 and Tr8. These transistors, which are respectively provided with narrow gate electrodes $31_1$, $31_2$, ..., as shown in FIG. 20A, are arrayed in the bit line direction and the word lines. Two lines of PMOS sense amplifiers $25_1$ and $25_2$ are arrayed in the direction of bit line extension. The sense amplifiers arrayed in the direction of bit line extension, for example, PSA0 and PSA1, are constructed each with two stages of MOS transistors, totally four stages of MOS transistors. In the PMOS transistor PAS0, for example, the gate electrodes $31_1$ and $31_2$ of the MOS transistors Tr1 and Tr2 are respectively connected to the paired bit lines BL0 and $\overline{BL0}$ at contact portions $32_1$ and $32_2$. The drains of those transistors are connected to the paired bit lines BL0 and $\overline{BL0}$ at contact portions $33_1$ and $33_2$. The sources of those transistors are connected to a common source wire φP continuously laid in the direction of the word line extension, at contact portions $34_1$ and $34_2$. It is noted that those transistors Tr1 to Tr8 are arrayed in the word line direction, one transistor for four bit lines.

The sense amplifier group $24_1$ having a series of NMOS sense amplifiers NSA1, NSA3, ..., NSAn-2, and the sense amplifier group $24_2$ having a series of NMOS sense amplifiers NSA0, NSA2, ... are located on both sides of the memory cell array 21. In other words, the sense amplifier groups $24_1$ and $24_2$ are located outside the sub-cell arrays $21_1$ and $21_2$, respectively.

In this embodiment, since one transistor is disposed for four bit lines, the design of the layout of the sense amplifiers is easy even when the bit line width and the bit line pitch are extremely narrow. Further, all of the PMOS sense amplifiers may be formed in an area between the sub-sense amplifier $21_1$ and $21_2$. Accordingly, those amplifiers may be gathered in one n-well, as shown in FIG. 20B. This indicates that the number of boundaries between the n-type well and p-type substrate is only two, and hence a width (distance #) required for the well separation of one memory cell is ½ the width of the conventional DRAM. The reduction of the well separation width leads to a great reduction of the required chip area.

To be more specific, consider a case that within the DRAM chip, the memory cell array is divided into 16 sub-arrays, and the well separation width (distance #) is 10 μm. In this case, the chip size reduction is 16×10 μm×2=320 μm=0.32 mm.

To further increase the memory capacity and the operation speed of the DRAM, the number of the sub-arrays may be increased to 32 and 64. In this case, figures of the chip size reduction are 0.64 mm and 1.28 mm.

Some additional embodiments of the present invention will be described.

Figure 21:
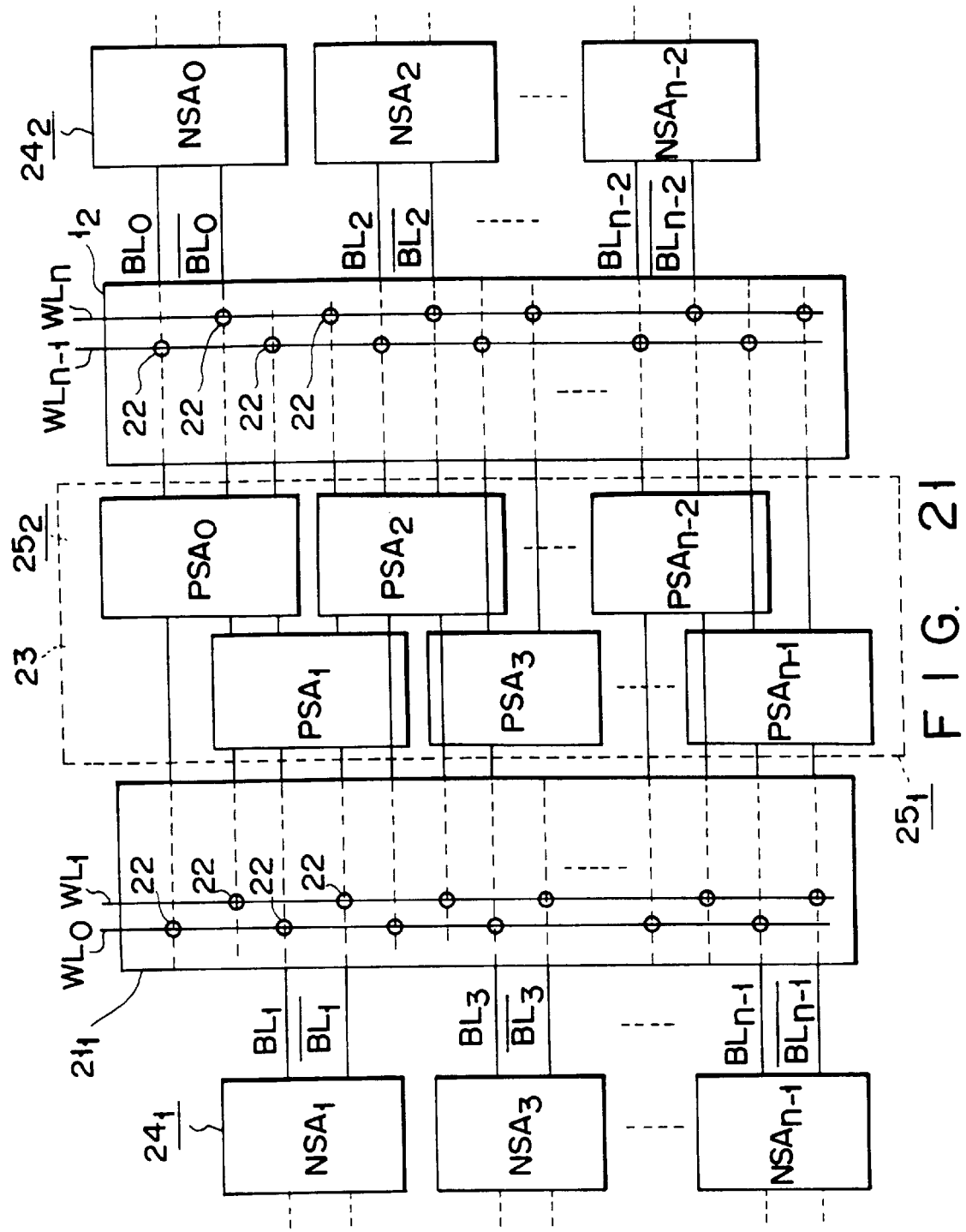
FIG. 21 shows a diagram of an arrangement of a DRAM according to an eighth embodiment of the present invention.

An embodiment of a DRAM shown in FIGS. 21 through 23 is featured in that of a plurality of bit lines, the adjacent bit lines are paired, and coupled with the corresponding bit lines. The remaining portions in the layout of the amplifier section are the same as those in the previous embodiment.

Figure 24:
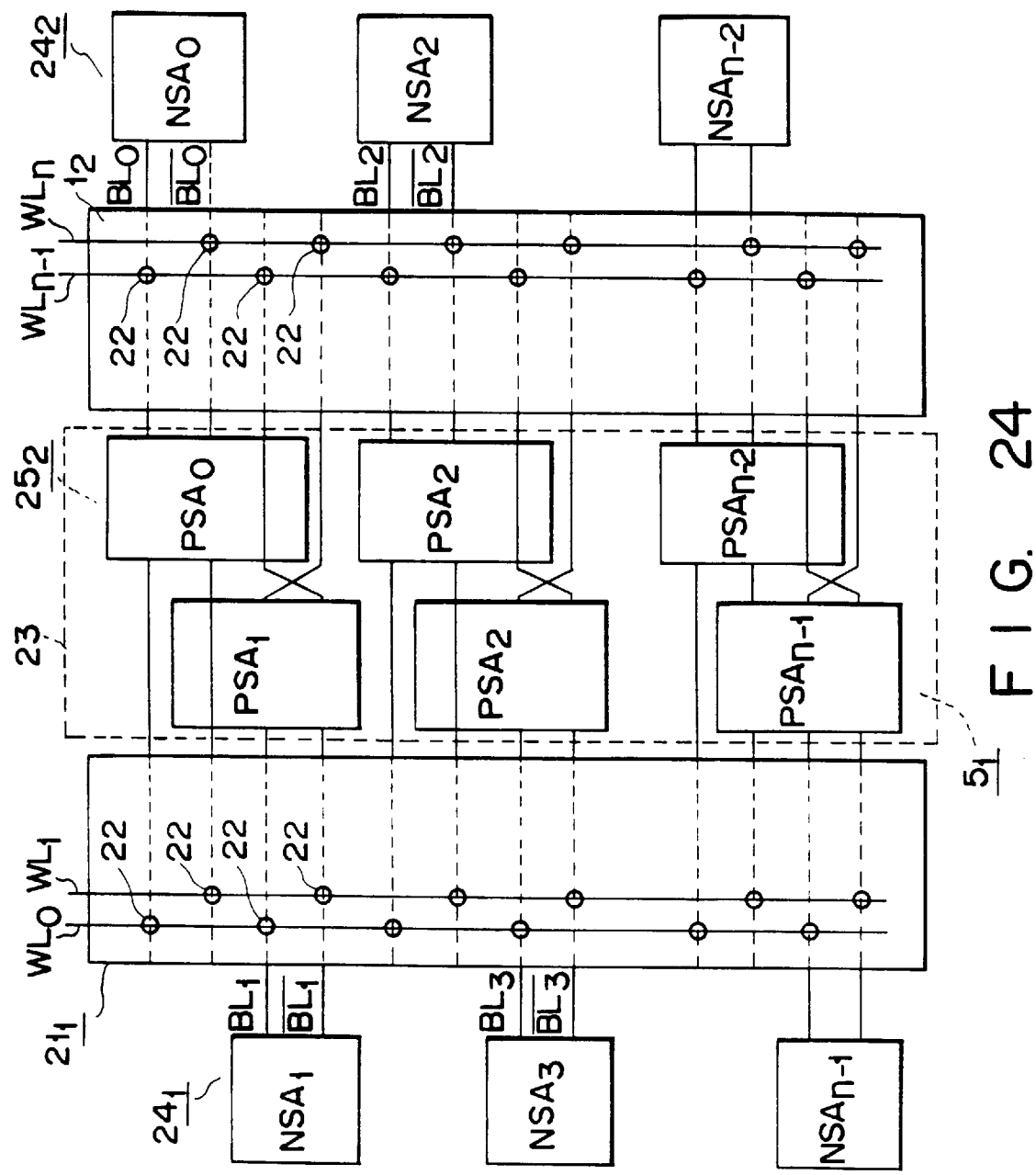
FIG. 24 shows a diagram of an arrangement of a DRAM according to a ninth embodiment of the present invention.
Figure 25:
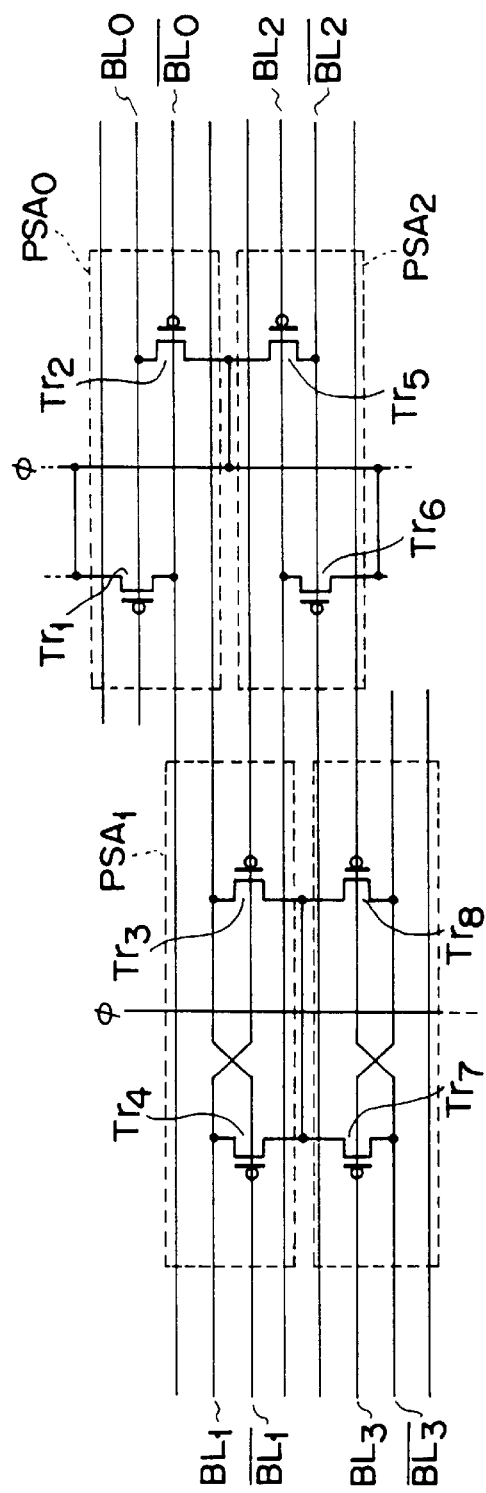
FIG. 25 is an equivalent circuit of the sense amplifier section of FIG. 24.
Figure 26:
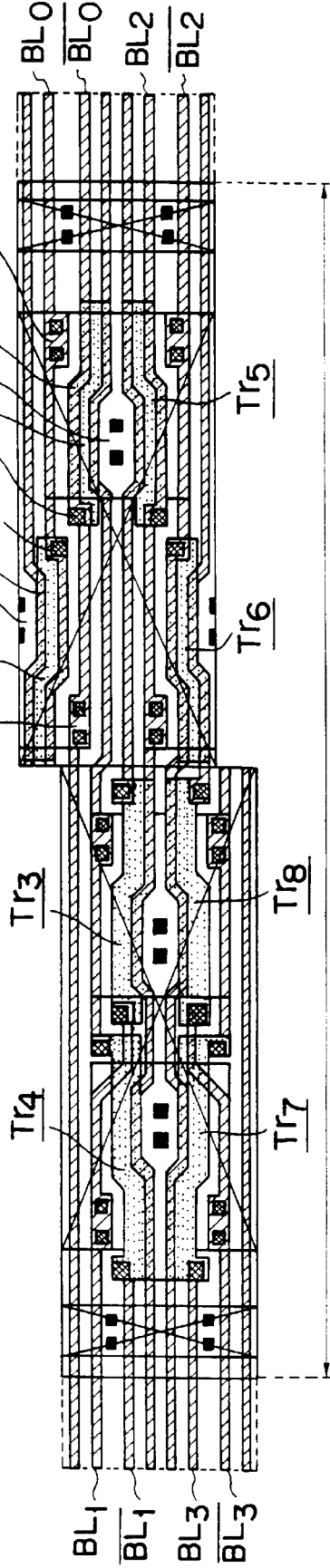
FIG. 26 is a plan view showing a layout of the sense amplifier section of FIG. 25.

In a further embodiment shown in FIGS. 24 through 26, paired bit lines BL1 and $\overline{BL1}$ are crossed at the mid point of the memory cell array 21, more exactly, above the second sense amplifier group. Additional paired bit lines BL3 and $\overline{BL3}$ are also crossed in a similar way. To this end, each bit line runs across the gate electrode in the transistor region. Therefore, there is no need for the wiring layers specially provided for the bit lines crossings, and the manufacturing steps for the wiring layers.

In addition to the useful effects of the previous embodiments, this embodiment may have the following effects.

With increase of the memory capacity of the DRAM, signals handled in the DRAM become small and the bit line pitch also becomes small. Accordingly, the interference between the bit lines through the stray capacitance existing between the bit lines is remarkable, leading to large noise. In this embodiment, since the bit lines are crossed at the mid point of the bit lines, such an interference is effectively cancelled out after a data signal attendant with the interference noise passes the crossing point.

An additional embodiment of the present invention is illustrated in FIG. 27. In this embodiment, PMOS sense amplifier groups $5_1$ and $5_2$ are formed in an n-well 3, which is located on the right side of the memory cell array, while those are located inside the memory array 21 in the FIG. 18 embodiment. This embodiment thus featured may have the advantageous effects comparable with those in the previous embodiments. Those sense amplifier groups may be located out of the center in the memory array or outside the NMOS sense amplifier group which is located outside the memory cell array 21. Further, the bit lines may be paired every other line, as shown in FIG. 18.

While in the above-mentioned embodiments only one memory cell array is used, a plurality of memory cell arrays may be arrayed in the bit line direction, as shown in FIG. 28. A basic arrangement of a DRAM according to this embodiment is the same as that of each of the previous embodiments. In this embodiment, the NMOS sense amplifier groups $24_1$ and $24_2$ are used by the memory cell arrays adjacent to them, respectively. Those amplifier groups are coupled with their adjacent cell arrays through MOS transistors as transfer gates, respectively. This feature reduces the number of the NMOS sense amplifier groups in the whole DRAM.

The arrangement of FIG. 28 is applicable for the embodiments of FIGS. 18, 24, and 27.

The above system in which the PMOS sense amplifier groups are used by their adjacent memory cell arrays, may reduce the number of the n-wells, but has the following problems. The PMOS sense amplifier is used to pull up the "H" level of the signal read out on the bit lines up to the power source voltage Vcc. In this case, to compensate for the voltage drop of the threshold voltage at the transfer gate transistor to select its related PMOS sense amplifier, it is necessary to apply a clock signal of an increased voltage to the gate of the transistor. Further, the resistance of the transfer gate transistor hinders the high speed operation of the memory.

In the above-mentioned embodiments, the n-well is formed in the p-type silicon substrate, and the PMOS sense amplifier groups are all formed in the n-well. Alternatively, those sense amplifier groups may be formed in a p-well formed in an n-type silicon substrate. The present invention effects for fabricating a semiconductor memory device wherein a p type well region is formed in a n-type silicon substrate and a semiconductor memory device wherein a n-type substrate has a p-type well region therein, and the PMOS sense amplifier group is fabricated in the n-type well region formed in the p-type well region. In the case of the triple well structure, since the separation width (distance #) between the well regions has a larger value, the chip size can be largely decreased.

While some specific embodiments have been described, the present invention may variously be modified and changed within the scope of the present invention.

As described above, in the DRAM based on the divided sense amplifier system according to the present invention, the restrictions on the design of the core circuit are remarkably relaxed. Further, the number of wells for the sense amplifiers is reduced to enable effective use of the chip area. Consequently, the present invention succeeded in realizing DRAMs of low cost and large memory capacity.

What is claimed is:

1. A dynamic semiconductor memory device comprising;
   a semiconductor substrate;
   a plurality of sense amplifiers each including first and second MOS transistors each having a gate electrode and a source region and a drain region which are formed in said semiconductor substrate;

a plurality of pairs of bit lines positioned above said sense amplifiers and extending in a first direction so that the first and second MOS transistors of one of said sense amplifiers and those of another sense amplifier adjacent thereto are positioned at four stages in the first direction within an area defined by two adjacent said pairs of bit lines and one of the first and second MOS transistors of one of said sense amplifiers is overlapped on one of bit lines connected to the first and second MOS transistors of said another sense amplifier, each of said pairs of bit lines having first and second bit lines along a direction perpendicular to which said source and drain regions of said sense amplifier are formed in said semiconductor substrate; and a plurality of dynamic memory cells arrayed along said pairs of bit lines; and said first and second MOS transistors of each of said plurality of sense amplifiers being separated in the first direction.

2. A dynamic semiconductor memory device comprising:

a semiconductor substrate;

first and second sense amplifiers arranged at different positions with respect to a first direction and a second direction orthogonal to the first direction such that said first and second sense amplifiers are separated from each other in the first direction and offset from each other in the second direction, each of said first and second sense amplifiers including two MOS transistors, each of the two MOS transistors having a gate electrode, and source and drain regions which are formed by a diffusion method in said semiconductor substrate along the second direction orthogonal to the first direction, the MOS transistors of all of said sense amplifiers being of the same conductivity type;

a plurality of bit lines positioned over said sense amplifiers and extending in a first direction so that the two MOS transistors of said first sense amplifier and those of said second sense amplifier are positioned at four stages in the first direction within an area defined by two adjacent said pairs of bit lines, and one of said gate electrode, drain and source regions of the first and second MOS transistors of said first sense amplifier is overlapped on one of wire regions of bit lines connected to said first and second MOS transistors of said second sense amplifier; and a plurality of dynamic memory cells arrayed along said bit lines.

3. A dynamic semiconductor memory device comprising:

a semiconductor substrate;

first and second sense amplifiers arranged at different positions with respect to a first direction and a second direction orthogonal to the first direction such that said first and second sense amplifiers are separated from each other in the first direction and offset from each other in the second direction, each of said first and second sense amplifiers including first and second MOS transistors each having a gate electrode, and source and drain regions formed in said semiconductor substrate by a diffusion method, said MOS transistors of all of said sense amplifiers being of the same conductivity type, said source and drain regions of each of said MOS transistors being separated from each other in the second direction, and said first and second MOS transistors of each of said sense amplifiers being separated in said first direction;

a plurality of bit lines positioned over said sense amplifiers and extending in the first direction so that the two MOS transistors of said first sense amplifier and those of said second sense amplifier are positioned at four stages in the first direction within an area defined by two adjacent said pairs of bit lines, and one of said gate electrode, drain and source regions of the first and second MOS transistors of said first sense amplifier is overlapped on one of wire regions of bit lines connected to said first and second MOS transistors of said second sense amplifier; and a plurality of dynamic memory calls arrayed along said bit lines.

4. A dynamic semiconductor memory device comprising:

a semiconductor substrate;

a plurality of sense amplifiers wherein each of said sense amplifiers includes first and second MOS transistors each of said MOS transistors having a gate electrode, and source and drain regions which are formed in said semiconductor substrate and separated with respect to each other;

a plurality of bit line pairs positioned over said sense amplifiers and extending in a first direction so that the first and second MOS transistors of one of said sense amplifiers and those of another sense amplifier adjacent thereto are positioned at four stages in the first direction within an area defined by two adjacent said pairs of bit lines, and one of said gate electrode, drain and source regions of the first and second MOS transistors of one of said sense amplifiers is overlapped on one of wire regions of bit lines connected to said first and second MOS transistors of said another sense amplifier;

a plurality of dynamic memory cells arrayed along said bit lines; and first and second control lines crossing over said bit line pairs and connected to said first and second MOS transistors of each of said sense amplifiers; and wherein the first and second MOS transistors of each of said plurality of sense amplifiers are connected to a corresponding one of said bit line pairs and are separated from each other in the first direction;

the first and second MOS transistors of each of said sense amplifiers having the same conductivity type and having their respective gate electrodes connected respectively to the first and second bit lines of the corresponding one of said bit line pairs, drain regions of the first and second MOS transistors of each of said sense amplifiers being connected respectively to the second and first bit lines of said corresponding one of said bit line pairs, and source regions of the first and second MOS transistors of each of said sense amplifiers being connected to respective ones of said first and second control lines, said drain and source regions of each of said MOS transistors are separated from each other in the second direction.

5. A dynamic semiconductor memory device according to claim 1, wherein one of the first and second bit lines is connected to the gate electrode of one of said first and second MOS transistors of one of said sense amplifiers and the other of the first and second bit lines being connected to the drain region of the same one of said first and second MOS transistors of one of said sense amplifiers.

6. A dynamic semiconductor memory device comprising:

a semiconductor substrate;

first and second sense amplifiers arranged such that said first and second sense amplifiers are separated from each other in a first direction, each of said first and second sense amplifiers including first and second MOS transistors each having a gate electrode, and source and drain regions formed in said semiconductor substrate, said MOS transistors of all of said sense amplifiers being of the same conductivity type, said source and drain regions of each of said MOS transistors being separated from each other in a second direction orthogonal to the first direction, and said first and second MOS transistors of each of said sense amplifiers being separated in the first direction so that each transistor of said sense amplifiers are arrayed one for four bit lines in the second direction; and a plurality of dynamic memory cells arrayed along said bit lines.

7. A dynamic semiconductor memory device comprising:

a semiconductor substrate;

a plurality of sense amplifiers wherein each of said sense amplifiers includes first and second MOS transistors, each of said MOS transistors having a gate electrode, said source and drain regions which are formed in said semiconductor substrate by a diffusion method and separated with respect to each other;

a plurality of bit line pairs positioned over said sense amplifiers and extending in a first direction so that the first and second MOS transistors of one of said sense amplifiers and those of another sense amplifier adjacent thereto are positioned within an area defined by two adjacent said pairs of bit lines, each of said bit line pairs including first and second bit lines which are separated from each other in a second direction orthogonal to the first direction so that the transistors of said sense amplifiers are arrayed one for four bit lines in the second direction;

a plurality of dynamic memory cells arrayed along said bit lines; and first and second control lines crossing over said bit line pairs and connected to said first and second MOS transistors of each of said sense amplifiers; and wherein said first and second MOS transistors of each of said plurality of sense amplifiers are connected to a corresponding one of said bit line pairs and are separated form each other in the first direction;

the first and second MOS transistors of each of said sense amplifiers having the same conductivity type and having their respective gate electrodes connected respectively to the first and second bit lines of the corresponding one of said bit line pairs, drain regions of the first and second MOS transistors of each of said sense amplifiers being connected respectively to said second and first bit lines of said corresponding one of said bit line pairs, and source regions of the first and second MOS transistors of each of said sense amplifiers being connected to respective ones of said first and second control lines, said drain and source regions of each of said MOS transistors being separated from each other in the second direction.

\* \* \* \* \*